United States Patent
Lee et al.

(10) Patent No.: US 11,085,881 B2
(45) Date of Patent: Aug. 10, 2021

(54) SURFACE-ENHANCED RAMAN SCATTERING SUBSTRATE, ELEMENT FOR DETECTING MOLECULE INCLUDING THE SAME, AND METHOD FOR MANUFACTURING THE SAME

(71) Applicant: The Industry & Academic Cooperation in Chungnam National University (IAC), Daejeon (KR)

(72) Inventors: Donghan Lee, Jecheon-si (KR); Jongmin Lee, Daejeon (KR); Ilsun Yoon, Ansan-si (KR); Jongseo Baek, Daejeon (KR)

(73) Assignee: The Industry & Academic Cooperation in Chungnam National University (IAC), Daejeon (KR)

( * ) Notice: Subject to any disclaimer, the term of this patent is extended or adjusted under 35 U.S.C. 154(b) by 208 days.

(21) Appl. No.: 16/301,922

(22) PCT Filed: May 17, 2017

(86) PCT No.: PCT/KR2017/005115
§ 371 (c)(1),
(2) Date: Nov. 15, 2018

(87) PCT Pub. No.: WO2017/200295
PCT Pub. Date: Nov. 23, 2017

(65) Prior Publication Data
US 2019/0310200 A1    Oct. 10, 2019

(30) Foreign Application Priority Data
May 17, 2016  (KR) .................. 10-2016-0060211

(51) Int. Cl.
*G01N 21/65* (2006.01)
*C23C 14/16* (2006.01)
(Continued)

(52) U.S. Cl.
CPC ............. *G01N 21/658* (2013.01); *B22F 1/00* (2013.01); *C23C 14/16* (2013.01); *C23F 1/02* (2013.01);
(Continued)

(58) Field of Classification Search
None
See application file for complete search history.

(56) References Cited

U.S. PATENT DOCUMENTS

| 8,896,829 B2 | 11/2014 | Furusho |
| 9,567,214 B2 | 2/2017 | Zhou et al. |
| 9,664,621 B2 | 5/2017 | Gibson et al. |

FOREIGN PATENT DOCUMENTS

| JP | 2009109395 | * | 5/2009 |
| JP | 2015014547 | * | 1/2015 |

(Continued)

*Primary Examiner* — Xiaobei Wang
(74) *Attorney, Agent, or Firm* — The Webb Law Firm

(57) ABSTRACT

A surface-enhanced Raman scattering substrate includes a floating-type first metal nanoparticle; a support body for supporting the first metal nanoparticle; and a second metal film which forms a nano gap with the first metal nanoparticle and is surrounding the circumference of the first metal nanoparticle, wherein a first metal of the first metal nanoparticle and a second metal of the second metal film, respectively, can be a metal generating surface plasmons thereon.

32 Claims, 11 Drawing Sheets

(51) Int. Cl.
   *C23F 1/02* (2006.01)
   *C23F 4/00* (2006.01)
   *G01N 21/25* (2006.01)
   *G01N 21/31* (2006.01)
   *B22F 1/00* (2006.01)
   *B32B 15/01* (2006.01)

(52) U.S. Cl.
   CPC ............... *C23F 4/00* (2013.01); *G01N 21/25* (2013.01); *G01N 21/31* (2013.01); *G01N 21/65* (2013.01); *B32B 15/01* (2013.01)

(56) References Cited

FOREIGN PATENT DOCUMENTS

| | | |
|---|---|---|
| JP | 2016508602 A | 3/2016 |
| JP | 2016510405 A | 4/2016 |
| KR | 101229065 B1 | 2/2013 |
| KR | 101272316 B1 | 6/2013 |
| KR | 1020130095718 A | 8/2013 |
| KR | 101589039 B1 | 1/2016 |

\* cited by examiner

SURFACE-ENHANCED RAMAN SCATTERING SUBSTRATE, ELEMENT FOR DETECTING MOLECULE INCLUDING THE SAME, AND METHOD FOR MANUFACTURING THE SAME

CROSS-REFERENCE TO RELATED APPLICATIONS

This application is the United States national phase of International Application No. PCT/KR2017/005115 filed May 17, 2017, and claims priority to Korean Patent Application No. 10-2016-0060211 filed May 17, 2016, the disclosures of which are hereby incorporated in their entirety by reference.

TECHNICAL FIELD

The present invention relates to a surface-enhanced Raman scattering substrate, an element for detecting a molecule including the same, and a method for manufacturing the same, and in particular, to a surface-enhanced Raman scattering substrate which is capable of detecting a molecule with high sensitivity and obtaining a uniform detection result even in a large area and which may be manufactured through an extremely low-priced simple process, an element for detecting a molecule, and a method for manufacturing the same.

BACKGROUND ART

A surface enhanced Raman scattering (SERS) spectroscopy is a spectroscopic method using a phenomenon in which Raman scattering intensity of molecules adsorbed to a nanostructured surface of a metal such as gold, silver, or the like, is greatly increased by $10^6$ to $10^8$ times. It is a very sensitive technology capable of obtaining a large amount of information through a single measurement by vector quantity data, directly measuring a single molecule, and directly measuring information regarding a vibration state of a molecule or a molecular structure so as to be admitted as a powerful analysis method for chemical/biological/biochemical analysis.

For sensitivity, quantitative analysis, measurement reliability and reproducibility of the SERS spectroscopy, a strictly well-defined hot spot must be formed with high density and a detection target (i.e., an object to be detected) must be positioned adjacent to the hot spot.

In order to commercialize SERS substrates, that is, to mass-produce SERS substrates at a low cost, a technique for forming nanogaps having a uniformly well-defined size with high density even in a large area through a simple process such as deposition or a heat-treatment, rather than a high-priced, difficult process such as lithography, is required.

Normally, SERS sensors using nanoparticles, as in Korean Patent Laid-Open Publication No. 2013-0095718, have been most commonly studied. However, since an arrangement of metal nanoparticles has a random structure based on probability, lacking a defined structure, and thus, it is difficult to obtain reproducibility and accuracy of detection. Furthermore, a location of hot, density of the hot spot, and the like, are not well defined, which is an obstacle to a quantitative analysis.

DISCLOSURE

Technical Problem

An object of the present invention is to provide a surface enhanced Raman scattering (SERS) substrate having a precisely controlled hot spot, allowing a quantitative analysis and having excellent reliability and reproducibility of measurement.

Another object of the present invention is to provide a SERS substrate having very fine gaps uniformly even in a large area.

Another object of the present invention is to provide a SERS substrate having a uniform surface plasmon activity even in a large area and having high-density hot spots to obtain excellent sensitivity of measurement and commerciality.

Another object of the present invention is to provide a SERS substrate in which a measurement target material is positioned in hot spots or adjacent to the hot spot, thereby significantly enhancing signal enhancement by the hot spot.

Another object of the present invention is to provide a manufacturing method which eliminates the necessity of high-priced equipment or high level of process control and which is capable of manufacturing a high-quality SERS substrate by a very simple method incurring low cost for establishing a process.

Technical Solution

In one general aspect, a surface enhanced Raman scattering (SERS) substrate includes: a floating-type first metal nanoparticle; a supporting the first metal nanoparticle; and a second metal film forming a nanogap with the first metal nanoparticle and surrounding the circumference of the first metal nanoparticle, wherein a first metal of the first metal nanoparticle and a second metal of the second metal film each are metals generating surface plasmons.

In the SERS substrate according to an exemplary embodiment of the present invention, a bottom face of the first metal nanoparticle supported by the support body may be planar.

In the SERS substrate according to an exemplary embodiment of the present invention, a nanogap may be formed by the first metal nanoparticle and a side surface of the second metal film including an edge of the second metal film surrounding the circumference of the first metal nanoparticle.

In the SERS substrate according to an exemplary embodiment of the present invention, the nanogap may have a closed-loop shape.

In the SERS substrate according to an exemplary embodiment of the present invention, the bottom face may include both a supported region forming an interface with the support body and a non-supported region exposed to a surface.

In the SERS substrate according to an exemplary embodiment of the present invention, an area of 10% to 80% with respect to an area of the bottom face may form an interface with the support body.

In the SERS substrate according to an exemplary embodiment of the present invention, a detection target may be positioned in a space defined by the first metal nanoparticle including the non-supported region of the bottom face of the first metal nanoparticle, a side surface of the second metal film, and a side surface of the support body.

In the SERS substrate according to an exemplary embodiment of the present invention, the floating-type first metal nanoparticle supported by the support body may be positioned inside a penetrating pore of the second metal film.

In the SERS substrate according to an exemplary embodiment of the present invention, the first metal nanoparticle, the penetrating pore, and the support body may form a concentric structure with each other.

In the SERS substrate according to an exemplary embodiment of the present invention, the SERS substrate may further include a lower film positioned below the second metal film and the floating-type first metal nanoparticle.

In the SERS substrate according to an exemplary embodiment of the present invention, the lower film may be formed of the same material as that of the support body, and the support body may extend from the lower film.

In the SERS substrate according to an exemplary embodiment of the present invention, the lower film may be a metal film (third metal film).

In the SERS substrate according to an exemplary embodiment of the present invention, a receptor specifically binding to a detection target material may be formed on a surface of the lower film positioned below the floating-type first metal nanoparticle or on a surface of a side portion of the support body.

In the SERS substrate according to an exemplary embodiment of the present invention, the support body may be formed of one or two or more selected from among a metal compound and a semiconductor compound, and independently thereof, the lower film may be formed of one or two or more selected from among a metal, a metal compound and a semiconductor compound.

In the SERS substrate according to an exemplary embodiment of the present invention, the first metal nanoparticle may have a truncated particle shape.

In the SERS substrate according to an exemplary embodiment of the present invention, a size of the nanogap may be 1 nm to 100 nm.

In the SERS substrate according to an exemplary embodiment of the present invention, the size of the nanogap may be adjusted by one or more factors selected from among a length of the support body and a thickness of the second metal film.

In the SERS substrate according to an exemplary embodiment of the present invention, an average diameter of a projected shape of the first metal nanoparticle may be 10 nm to 500 nm.

In the SERS substrate according to an exemplary embodiment of the present invention, a thickness of the second metal film may be 10 nm to 100 nm.

In the SERS substrate according to an exemplary embodiment of the present invention, a density of the nanostructures, which is the number of the first metal nanoparticles per unit area, may be 1 to 100 per $\mu m^2$.

In the SERS substrate according to an exemplary embodiment of the present invention, the substrate may include an SERS activity region in which the floating-type first metal nanoparticle is formed and an SERS non-activity region in which the floating-type first metal nanoparticle is not formed, and two or more SERS activity regions are arranged to be spaced apart from each other.

In the SERS substrate according to an exemplary embodiment of the present invention, the first metal of the first metal nanoparticle and the second metal of the second metal film may be metals generating surface plasmons independently of each other.

In the SERS substrate according to an exemplary embodiment of the present invention, the first metal of the first metal nanoparticle and the second metal of the second metal film may be silver, gold, platinum, palladium, nickel, aluminum, copper, chromium, or a combination thereof, or an alloy thereof, independently of each other.

In the SERS substrate according to an exemplary embodiment of the present invention, the support body may include $ZrO_2$, $ZnO$, $YF_3$, $YbF_3$, $Y_2O_3$, $TiO_2$, $ThF_4$, $TbF_3$, $Ta_2O_5$, $GeO_2$, $TeO_2$, $SiC$, diamond, $SiO_xN_y$ (x is a real number and $0<x<2$, y is a real number and $0<y<1.5$), $SiO_2$, $SiO$, $SiN_x$ (x is a real number and $1 \le x \le 1.5$), $Sc_2O_3$, $NdF_3$, $Na_3AlF_6$, $MgF_2$, $LaF_3$, $HfO_2$, $GdF_3$, $DyF_3$, $CeF_3$, $CaF_2$, $BaF_2$, $AlF_3$, $Al_2O_3$, indium-tin oxide (ITO), or a mixture thereof.

In another general aspect, an element for detecting a molecule according to an exemplary embodiment of the present invention may include a surface enhanced Raman scattering (SERS) substrate.

The element for detecting a molecule according to an exemplary embodiment of the present invention may include the aforementioned SERS substrate and a floating-type first metal nanoparticle, a support body supporting the first metal nanoparticle, and a microfluid channel forming a nanogap with a first metal nanoparticle of at least a second metal film and accommodating a region surrounding the circumference of the first metal nanoparticle therein.

In another general aspect, a method for manufacturing a surface enhanced Raman scattering (SERS) substrate includes: a) forming a compound film as a metal compound or a semiconductor compound on a base substrate; b) forming a first metal film on the compound film and performing a heat treatment thereon to form first metal nanoislands positioned to be spaced apart from each other on the compound film; c) isotropic-etching the compound film to a predetermined depth using the first metal nanoislands as an etching mask; and d) depositing a second metal on the etched compound film using the first metal nanoislands as a deposition mask to form a second metal film.

In the method for manufacturing an SERS substrate according to an exemplary embodiment of the present invention, the metal compound or the semiconductor compound of the compound film may be one or two or more selected from among a metal halide including a metal oxide, a metal oxynitride, a metal nitride, and a metal fluoride, a metal carbide, a semiconductor oxide, a semiconductor oxynitride, a semiconductor nitride, a semiconductor carbide, and a semiconductor material.

In the method for manufacturing an SERS substrate according to an exemplary embodiment of the present invention, operation b) may include controlling a density of the first metal nanoislands by repeatedly performing a unit process including b1) forming a first metal film; b2) performing a heat treatment.

In the method for manufacturing an SERS substrate according to an exemplary embodiment of the present invention, the isotropic etching may be wet etching.

In the method for manufacturing an SERS substrate according to an exemplary embodiment of the present invention, in operation c), dry etching may be further performed before or after the isotropic etching.

The method for manufacturing an SERS substrate according to an exemplary embodiment of the present invention may further include: forming a lower film of metal film or a film of a metal compound or a semiconductor compound different from the compound film on the base substrate, before operation a), wherein the lower film may be exposed to a surface in a region not protected by an etching mask through etching including the isotropic etching in operation c).

In the method for manufacturing an SERS substrate according to an exemplary embodiment of the present invention, an etched compound film may remain by etching including the isotropic etching in operation c).

In the method for manufacturing an SERS substrate according to an exemplary embodiment of the present invention, the deposition in operation d) may be directional deposition including thermal evaporation or e-beam evaporation.

In the method for manufacturing an SERS substrate according to an exemplary embodiment of the present invention, a size of the nanogap may be adjusted by controlling at least one of factors of an etching depth in operation c) and a deposition thickness in operation d).

In the method for manufacturing an SERS substrate according to an exemplary embodiment of the present invention, a patterned first metal film may be formed in operation b).

In operation b), a thickness of the first metal film may be 1 nm to 50 nm.

The method for manufacturing an SERS substrate according to an exemplary embodiment of the present invention, may further include: forming a receptor specifically binding to a detection target on the metal film exposed to the surface after etching in operation c) before or after operation d) or surfaces of the compound film remaining after etching in operation c) and the support body.

In the method for manufacturing an SERS substrate according to an exemplary embodiment of the present invention, the heat treatment in operation c) may be performed by a rapid thermal process (RTP).

Advantageous Effects

The SERS substrate according to the present invention may form hot spots by a nanogap with a precisely controlled size, and the high density of hot spots enables quantitative analysis of a detection target and sensitivity of measurement, reliability, and reproducibility may be enhanced.

Further, the SERS substrate according to the present invention has an advantage that the ultrafine nanogaps in nanometer order are uniformly formed even in a large area, and detection intensity is remarkably improved.

In addition, according to the SERS substrate according to the present invention, since a detection target material is located in the empty space defined below the floating-type metal nanoparticle, the detection target material is fixed to the hot spot or fixed very close to the hot spot, remarkably enhancing detection intensity.

Further, the SERS substrate according to the present invention is advantageous in that, since the size of the nanogap is controlled by the factors which can be strictly and easily adjusted such as the length of the support body supporting the floating-type metal nanoparticles or the thickness of the metal film, the nanogaps are very precisely and uniformly controlled even in a large area. Accordingly, it is possible to produce a substrate having a large area, and a uniform surface plasmon activity on average may be obtained, regardless of position in the manufactured large substrate.

Further, the SERS substrate according to the present invention is advantageous in that it may be manufactured through a low-priced, simple process and has extremely excellent commercial properties.

The method of manufacturing a SERS substrate according to the present invention is advantageous in that the above-described high quality SERS substrate may be manufactured by only three kinds of processes such as deposition, heat treatment, and etching. Accordingly, since the SERS substrate is manufactured by process parameters that may be controlled easily and may be controlled in a strict manner, thereby improving productivity and yield. In addition, there is an advantage that the SERS substrate having a predetermined surface plasmon activity may be reproducibly manufactured, and the occurrence of defects due to unexpected changes in surface plasmon activity may be remarkably reduced.

The method of manufacturing a SERS substrate according to the present invention may also be used to manufacture a substrate having SERS activity irrespective of a concavo-convex structure, although the intentional convexo-concave structure conforms to the purpose of the surface of the base substrate as a physical support body. This is very advantageous when considering microchannel formation or compounding with other detection elements.

The method of manufacturing a SERS substrate according to the present invention is also advantageous in that a substrate having a homogeneous surface plasmon activity may be manufactured even on a large base substrate.

BEST MODE

Figure 1:
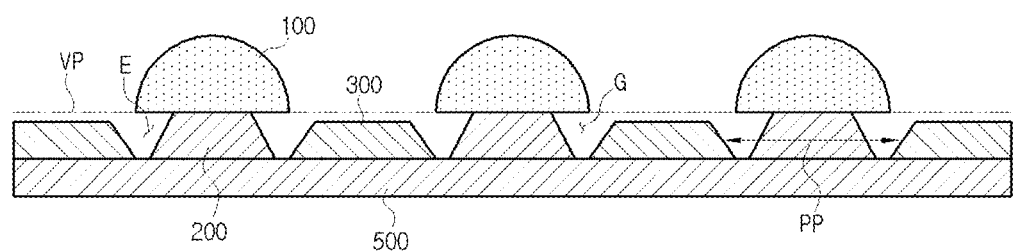
FIG. 1 is a cross-sectional view of a surface enhanced Raman scattering (SERS) substrate according to an exemplary embodiment of the present invention.

Hereinafter, a surface-enhanced Raman scattering (SERS) substrate, an element including the same, and a method for manufacturing a substrate according to the present invention will be described in detail with reference to the accompanying drawings. The drawings presented hereinafter are provided as examples to sufficiently transmit the technical concept of the present invention. Thus, the present invention is not limited to the drawings presented hereinafter and may be embodied in a different form, and the drawings present hereinafter may be exaggerated to be illustrated to clarify the technical concept of the present invention. Here, technical terms and scientific terms have the same meaning as generally understood by person skilled in the art to which the present invention pertains, unless otherwise defined, and a detailed description for a related known function or configuration considered to unnecessarily divert the gist of the present invention will be omitted in the following descriptions and accompanying drawings.

A surface-enhanced Raman scattering (SERS) substrate according to the present invention includes a floating-type first metal nanoparticle, a support body supporting the first metal nanoparticle, and a second metal film forming a nanogap with the first metal nanoparticle and surrounding the circumference of the first metal nanoparticle.

In describing the present invention, a first metal of the first metal nanoparticle and a second metal of the second metal film may be metals that generate surface plasmons according to an interaction with light independently of each other. In a specific example, the first metal of the first metal nanoparticle and the second metal of the second metal film may be silver, gold, platinum, palladium, nickel, aluminum, copper, chromium, or a mixture thereof, or an alloy thereof, independently of each other, but the present invention is not limited thereto and the first metal and the second metal may be metals that generates surface plasmons.

In describing the present invention, floating of the floating-type first metal nanoparticle may mean that a size of the support body is smaller than a size of the first metal nanoparticle so the first metal nanoparticle is supported by the support body and has a floating region.

Specifically, floating may mean that a supported region, which is in contact with the support body and is supported by the support body, and a non-supported region (surface region) which is not supported by the support body and forms a surface, coexist on a lower side surface of the first metal nanoparticle. Here, the lower side surface of the first metal nanoparticle may refer to a surface of the side on which the first metal nanoparticle is supported by the support body.

In other words, floating may mean that a lower space of the first metal nanoparticle which is supported by the support body is not wholly filled with the support body but the support body and an empty space coexist therein.

The empty space formed due to the floating structure serves to confine a detection target to a hot-spot generation region to significantly enhance detection sensitivity, reproducibility of detection, and detection intensity (Raman signal intensity).

Also, since the first metal nanoparticle has the floating structure and a nanogap is formed between the first metal nanoparticle and the second metal film surrounding the circumference of the floating-type first metal nanoparticle, a closed loop type hot spots, rather than a point type hot spot, may be provided.

As known, hot spot refer to a region where a very strong local electric field is formed and localized surface plasmon resonance (LSPR) occurs, and may be formed by a contact point, a nanogap, or the like, between nanostructures of metals where surface plasmons occur.

A closed loop type linear hot spot means that a substrate has a closed loop type linear LSPR generation region, and, due to the linear LSPR generation region, intensity of a Raman signal may be significantly increased to enhance detection sensitivity.

More specifically, the bottom face of the first metal nanoparticle, the surface of the side of the floating-type first metal nanoparticle supported by the support body, may be planar. In this case, floating may mean that the bottom face is not wholly supported by the support body and the region supported by the support body and the region not supported by the support body may coexist in the bottom face.

The bottom face having the flat plane is particularly advantageous for forming a strictly controlled nanogap, together with the second metal film. As known, since detection intensity is varied even by a fine change in size of the nanogap, research has continuously been conducted to realize a well-defined nanogap to enhance reproducibility and sensitivity for detection.

When the first metal nanoparticle has a bottom face as the plane, a nanogap may be formed by the first metal nanoparticle and a side surface of the second metal film including an edge of the second metal film surrounding the circumference of the first metal nanoparticle. Specifically, the nanogap may be formed at least by an edge of the bottom face and the edge of the second metal film surrounding the circumference of the first metal nanoparticle. This means that the nanogap is formed by the plane (bottom face) and the plane (the surface of the second metal film) spaced apart from each other. Since the nanogap is formed by the two planes, the nanogap with strictly controlled of its size may be formed and the nanogap which is extremely fine in nanometer order may be formed.

FIG. 1 is a cross-sectional view of a SERS substrate according to an exemplary embodiment of the present invention. As illustrated in FIG. 1, a first metal nanoparticle 100 is supported by a support body 200 and has a floating structure having an empty space E in a region below the first metal nanoparticle 100. Also, the second metal film 300 located on a base substrate 500 has a structure that forms a nanogap G with the first metal nanoparticle 100 and surrounds the circumference of the first metal nanoparticle 100.

The second metal film 300 may be a film having a penetrating pore PP formed therein. Since the first metal nanoparticle 100 supported by the support body 200 is positioned inside the penetrating pore PP of the second metal film 300, the second metal film 300 may form the nanogap G with the first metal nanoparticle 100 and has a structure surrounding the circumference of the first metal nanoparticle 100. Thus, a side surface of the second metal film including the edge of the second metal film forming the nanogap with the first metal nanoparticle may refer to a pore face of the penetrating pore PP including the edge of the penetrating pore PP.

As in the example illustrated in FIG. 1, in an exemplary embodiment according to the present invention, a bottom face BS of the first metal nanoparticle 100 may be planar. The bottom face BS of the first metal nanoparticle 100 may be a surface of the side of the metal nanoparticle 100 supported by the support body 200.

In detail, the bottom face BS of the first metal nanoparticle 100 may be a plane parallel to the surface of the second metal film, a plane parallel to the surface of the base substrate 500, for example, a horizontal plane.

When the bottom face BS of the first metal nanoparticle 100 is a flat plane, at least the nanogap formed in the form of a closed curve along the edge of the bottom face BS may have a very uniform size, regardless of position in the closed curve. Accordingly, a very uniform and very strong local electric field in the form of a closed loop may be formed between the first metal nanoparticle 100 and the second metal film 300.

As illustrated in FIG. 1, when the floating-type first metal nanoparticle 100 and the support body 200 are assumed to be one unit body, two or more unit bodies may each be positioned inside the penetrating pore PP of the second metal film 300.

That is, the SERS substrate may include the second metal film 300 having a plurality of penetrating pores PP arranged to be spaced apart from each other on the base substrate 500, the floating-type first metal nanoparticles 100 positioned inside the penetrating pores PP, respectively, and forming a nanogap with the second metal film 300, and the support bodys 200 respectively supporting the first metal nanoparticles 100.

In this case, the bottom face BS of the first metal nanoparticle 100 located in each of the penetrating pores PP may be located in a virtual single plane VP. That is, the bottom faces of the first metal nanoparticles 100 located in the SERS substrate may be located in the single plane VP.

Accordingly, the nanogaps formed in the SERS substrate may have an extremely uniform size, regardless of position on the SERS substrate, and an extremely uniform SERS activity may be obtained even in a substrate having a large area.

As described above, the SERS substrate according to an exemplary embodiment of the present invention may have a uniform SERS activity although it is a substrate having a large area.

This is because hot spots are formed by the nanogap formed between the second metal film 300 and the first metal nanoparticle 100. In detail, the hot spot may be formed by the surface of the first metal nanoparticle including the bottom face of the first metal nanoparticle 100 and the penetrating pore face of the second metal film including the edge of the penetrating pore of the second metal film 300. Since the hot spots formed in the substrate result from the planes of surfaces including the aforementioned virtual plane VP and the pore face of the second metal film 300, the hot spots present in the substrate may have nanogaps having the same size, regardless of positions of the hot spots in the substrate. In addition, the sizes of the nanogaps may be uniformly adjusted throughout the substrate by adjusting one or more factors selected from among a length (height) of the support body 200 and a thickness of the second metal film 300.

That is, since the bottom face of the first metal nanoparticle 100 is flat, the bottom faces (including the edge) may be positioned at a strictly well-defined height by adjusting a length of the support body 200. Also, since the second metal film 300 also has a plane surface, a surface position of the second metal film may be positioned at a strictly well-defined height by adjusting a thickness of the second metal film.

Thus, since both of the elements (the bottom face of the first metal nanoparticle and the surface of the second metal film including the penetrating pore face of the second metal film) forming the nanogap have the strictly well controlled position, the nanogap having the strictly well controlled size may be formed. Also, since the positions of the two factors forming the nanogap are determined by the length of the support body or the thickness of the second metal film, the size of the nanogap may be strictly adjusted by simply adjusting one or more selected from among the length (height) of the support body and the thickness of the second metal film. Also, as described above, although the substrate has a large area, since the bottom faces of the first metal nanoparticles positioned on the substrate are positioned at the same position (same plane), the sizes of the nanogaps may be very uniformly adjusted throughout the substrate. Also, in the SERS substrate according to the present invention, since the ultrafine nanogaps in a nanometer (nm) order are uniformly formed with a predetermined size even in a large area, a significantly enhanced detection intensity may be obtained. The ultrafine gaps and the gaps having the uniform size may significantly enhance sensitivity of detection and reliability (reproducibility of detection) of the element. Also, by controlling a metal material of the first metal nanoparticle, a metal material of the second metal film, the size of the nanogap, the size (average size) of the first metal nanoparticle, and the like, LSPR wavelength of the substrate may also be easily adjusted.

As described above, since the SERS substrate according to an exemplary embodiment of the present invention has hot spots formed by the floating-type first metal nanoparticle and the second metal film, the hot spot well controlled throughout the substrate may be formed in the SERS substrate. Also, although the substrate has a large area, it may exhibit a uniform plasmon activity.

In an exemplary embodiment of the present invention, when the bottom face BS of the first metal nanoparticle 100 is a plane surface, the bottom face BS may have both the supported region forming an interface with the support body 200 and the non-supported region exposed to the surface as described above. Due to the non-supported region, the empty space E may be formed below the first metal nanoparticle 100.

Figure 2:
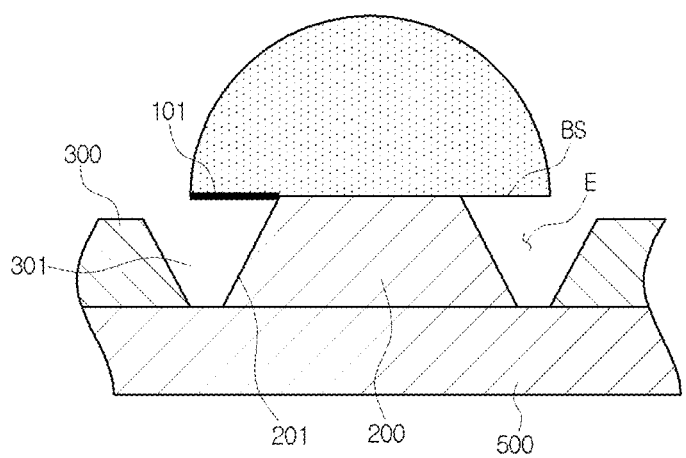
FIG. 2 is another cross-sectional view of a SERS substrate according to an exemplary embodiment of the present invention.

In detail, since the first metal nanoparticle 100 has a floating structure, a detection target may be positioned in an empty space E defined by a side surface 301 of the second metal film 300 surrounding the first metal nanoparticle 100, the first metal nanoparticle 100 including the non-supported region 101 of the bottom face BS of the first metal nanoparticle, and a side surface 201 of the support body 200 as in an example illustrated in FIG. 2. That is, the empty space E may be a space in which a detection target is positioned and detected by Raman scattering, and in this aspect, the empty space E may be referred to as an analysis space. Here, the side surface 301 of the second metal film 300 may correspond to a pore face of the penetrating pore formed in the second metal film 300.

A ratio of the area of the supported region forming an interface with the support body with respect to the area of the bottom face may affect the extent of the empty space formed below the first metal nanoparticle. Thus, the ratio of the area of the supported region may be a ratio in which the empty space E is formed to allow the detection target to be present in the hot spot region or hot spots adjacent region, while the first metal nanoparticle is physically stably supported.

In a specific example, an area of 10% to 80% with respect to the area of the bottom face may form an interface with the support body. That is, the area of the supported region may be 10 to 80% of the area of the bottom face. In terms of stably supporting the first metal nanoparticle, controlling a position of the detection target to a vicinity of the hot spot, easily securing the detection target, and preventing formation of metal nanoparticles on a side surface of the support body when a second metal (to be described hereinafter) is deposited, the area of the supported region may be preferably 30% to 80%, and, more preferably, 40% to 80%, of the area of the bottom face.

As illustrated in FIG. 1 or 2, the first metal nanoparticle 100 in which a bottom face is a plane surface may have a truncated particle shape or plate-like shape. The truncated particle shape may be a shape including a plane and a convex curved face. The plate-like shape may include a polygonal plate such as a quadrangular (including rectangular and square shapes) or a triangular plate, a circular plate, or an oval plate. Specifically, the first metal nanoparticle 100 may have a truncated particle shape, and the truncated particle shape may be a truncated sphere shape or a truncated capsule shape. A cut plane in the truncated sphere shape or the truncated capsule shape may correspond to the bottom face described above. Here, it should be appreciated that the truncated sphere shape includes a curved face having two or more different curvatures, as well as a curved face having a single curvature and that the cut face includes a cut shape in a rectangular sphere having an oval shape, as well as a circle. Also, the truncated capsule shape may be interpreted as a cylindrical or oval container in which one end is plane and the other has a curved face, and may also be interpreted such that the truncated sphere is elongated in a direction perpendicular to the cut face.

Materially, the first metal nanoparticle 100 may be a single metal (including a single alloy) from which surface plasmon is generated or a layered particle in which two or more metals from which surface plasmon is generated are stacked. In detail, when the first metal nanoparticle 100 is a single metal region, the first metal nanoparticle may be silver, gold, platinum, palladium, nickel, aluminum, copper, chromium, or an alloy thereof having the truncated particle shape described above. Also, when the first metal nanoparticle 100 is a layered particle in which two or more metals are stacked, the first metal nanoparticle 100 may include a particle of (1-1)-th metal particle including one plane and a convex curved face and a coating layer of (1-2)-th metal stacked to cover at least a portion of the convex curved face of the (1-1)-th metal. Here, the (1-1)-th metal and the (1-2)-th metal may be silver, gold, platinum, palladium, nickel, aluminum, copper, chromium, or an alloy thereof. More specifically, when the first metal nanoparticle 100 has the layered particle shape, it may have a structure in which a (1-2)-th metal coating layer, which has a curved face (second curved face) with a curvature equal to or different from that of a (1-1)-th metal particle which has a curved face (first curved face) with a predetermined curvature and has a truncated sphere shape, is stacked on an upper portion of the first curved face and is in contact with the first curved face. In this case, the first metal nanoparticle 100 may have a truncated particle shape having a bottom face resulting from the cut face of the (1-1)-th metal particle, a bottom surface which is in contact with the bottom face and results from the curved face of the (1-1)-th metal particle, and an upper surface which is in contact with the first surface and results from the second curved face of the (1-2) metal coating layer (See the first metal nanoparticle of FIG. 8). Here, referring to only the (1-2)-th metal coating layer independently, the (1-2)-th metal coating layer may have a surface as a convex second curved face and a concave surface transferred from the first curved face, and the (1-2)-th metal coating layer may be gradually reduced in thickness toward the edge from the center thereof. Also, in case where the thickness of the (1-2)-th metal coating layer is increased, the layered particle may correspond to a truncated capsule shape, rather than a truncated particle shape.

Figure 3:
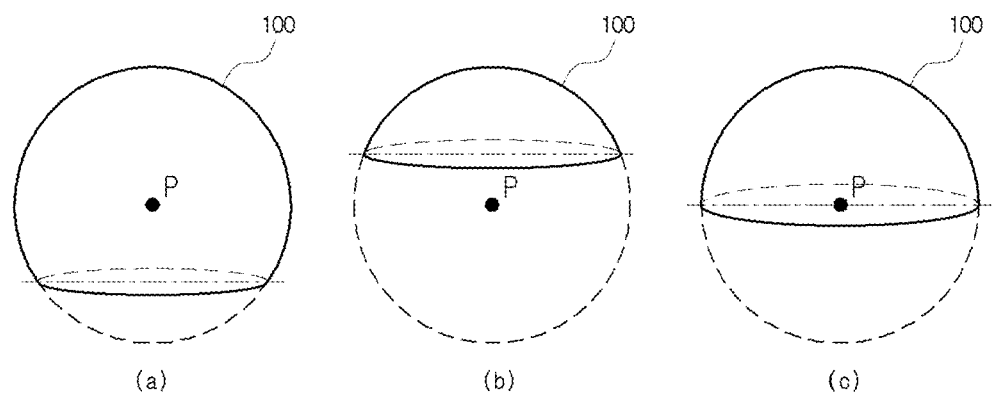
FIG. 3 is a perspective view illustrating examples of a first metal nanoparticle having a truncated sphere shape.

FIG. 3 is a perspective view illustrating examples of the first metal nanoparticle having truncated sphere shapes. The first metal nanoparticle 100 may have a shape in which a lower portion of a sphere is cut off with respect to the center P of the sphere as illustrated in FIG. 3(*a*), a shape in which an upper portion of a sphere is cut off with respect to the center P of the sphere as illustrated in FIG. 3(*b*), and a shape in which the center P of a sphere is cut off as illustrated in FIG. 3(*c*).

In this case, in the term of the truncated sphere shape, the sphere should not be construed as a true sphere. The sphere may refer to a solid having a circular or elliptical projected shape with respect to a projected shape. This is to consider a limitation in terms of difficulty in realizing the shape of the particle in the form of a true sphere in a strictly mathematical meaning due to limitations of the process, a realized specific process method, and the like, and this is well known to those skilled in the art related to nanostructures including nanoparticles. In describing a detailed configuration according to the present invention, a projection direction of a projected shape may refer to a direction from the first metal nanoparticle toward the support body, in other words, a bird's eye direction perpendicular to the bottom face BS of the first metal nanoparticle and from an upper side to a lower side, specifically, a projected shape in a direction in which the element is viewed from the above based on the first metal nanoparticle as an upper side in the element. Also, the projected shape may be a projected shape with respect to collimated light.

Figure 4:
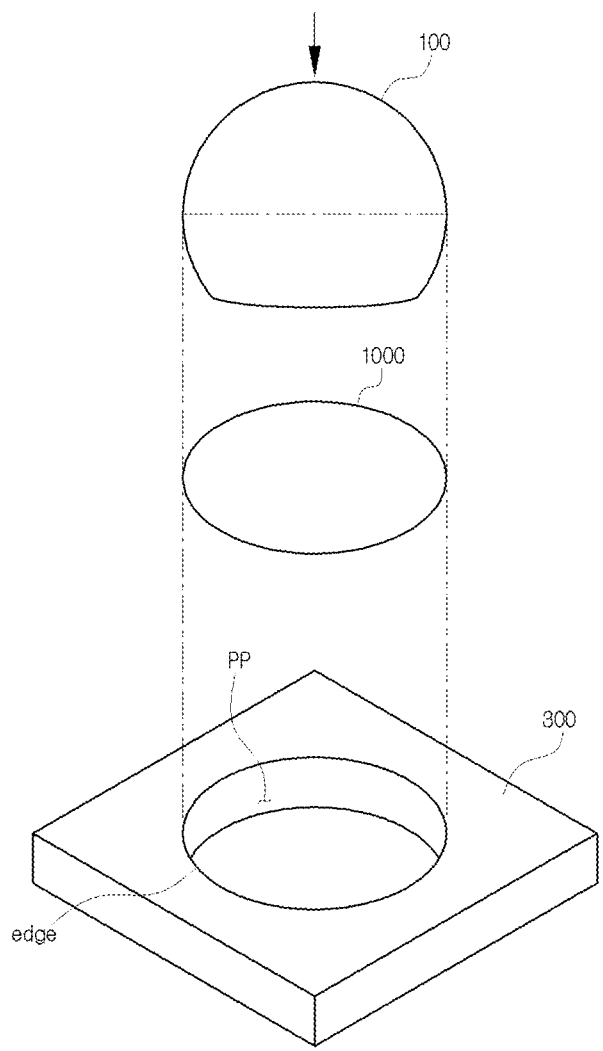
FIG. 4 is a specific perspective view illustrating a penetrating pore region in a second metal film.

FIG. 4 is a perspective view specifically illustrating a penetrating pore PP region in the second metal film 300. In FIG. 4, a shape of the penetrating pore PP may be defined by the first metal nanoparticle 100. in order to clarify a shape relationship between the first metal nanoparticle 100 and the penetrating pore PP, both the first metal nanoparticle 100 and a projected shape 1000 of the first metal nanoparticle 100 are illustrated together in FIG. 4.

As the example illustrated in FIG. 4, the shape of the penetrating pores PP may correspond to the projected shape 100 of the first metal nanoparticle 100. As described above, the projected shape is the direction from the collimated light reference first metal nanoparticle toward the support body, in other words, perpendicular to the bottom face (BS) of the first metal nanoparticle and projected in a bird's eye direction downwards, specifically, in a direction viewed from the top based on the first metal nanoparticle as an upper side in the element. Accordingly, when the first metal nanoparticle 100 is viewed as a combination of the cross-sections perpendicular to the projection direction, the projected shape may be a shape formed by coupling longest radius in each planar direction among radii in all directions (planar directions) perpendicular to the projection direction from the centers of the cross-sections.

As in the example of FIG. 3, when the first metal nanoparticle 100 has a truncated sphere shape, the projected shape 1000 may vary depending on the position of a cut face of the truncated sphere shape. In detail, in case where the cut face of the truncated sphere shape is positioned at the center or at an upper portion of the sphere as illustrated in FIG. 3(b) or 3(c), the projected shape 1000 may be the same as the lower face BS. In case where the cut face of the truncated sphere shape is positioned at a lower portion of the sphere as illustrated in FIG. 3(a), the projected shape 1000 may be the same as a cross-section of the center of the sphere, i.e., the bottom face BS of the first metal nanoparticle corresponding to FIG. 3(c).

The penetrating pore PP of the second metal film 300 may have a shape corresponding to the projected shape 1000 of the first metal nanoparticle 100 described above. In describing the detailed configuration according to the present invention, when it is described that one shape and another shape have a corresponding shape, it may mean that one shape and the other shape are the same or have a magnified or reduced shape. In detail, the penetrating pore PP of the second metal film 300 may be substantially the same as the protected shape 1000 of the first metal nanoparticle 100.

When this is described in the aspect of a manufacturing method, the floating-type nanoparticle of a first metal supported by the support body 200 is formed, and thereafter, a second metal is deposited using the nanoparticle of the first metal as a deposition mask to form the second metal film 300. Here, when the second metal is deposited, since the nanoparticle of the first metal is used as a mask, the second metal may also be deposited on the nanoparticle of the first metal used as a mask. The first metal nanoparticle 100 finally provided on the substrate has a shape in which the nanoparticle of the first metal used as a mask is slightly increased or elongated in the deposition direction, and thus, in case where a detailed configuration of the Raman scattering substrate in the aspect of the manufacturing method, the nanoparticle of the first metal used as a mask and the first metal nanoparticle are not particularly distinguished to be designated but generally referred to as the first metal nanoparticle.

As described above, as the second metal film is formed using the floating-type first metal nanoparticle as a deposition mask, a penetrating pore having a shape corresponding to the projected shape of the first metal nanoparticle 100 may be formed in the second metal film 300. In the aspect of manufacturing method, the formation of the penetrating pore PP using the first metal nanoparticle 100 as a deposition mask has an important technical significance.

In detail, the second metal film having the penetrating pore PP having a shape corresponding to the projected shape of the metal nanoparticle 100 is formed using the first metal nanoparticle 100 as a deposition mask, and a pore face of the penetrating pore including a surface side edge (indicated as 'edge' in FIG. 4) of the penetrating pore PP may form a nanogap with the bottom face BS of the metal nanoparticle 100. That is, since the film of the second metal is formed using the first metal nanoparticle 100 as a deposition mask, hot spots may be naturally defined simultaneously with the formation of the film.

That is, the hot spot may be formed in a self-aligning manner between the first metal nanoparticle and the second metal film.

Since the hot spot is generated in the self-aligning form, the hot spot may be formed to be strictly adjusted in both the shape and position on the substrate, and further, only the strictly adjusted hot spot may be present and an ultrafine nanogap may be formed. Due to the generation of the hot spot in the self-aligning form, reliability of measurement and reproducibility of the SERS substrate may be significantly increased, productivity may be significantly increased when the SERS substrate is manufactured, and quality control may be very easily performed.

Figure 5:
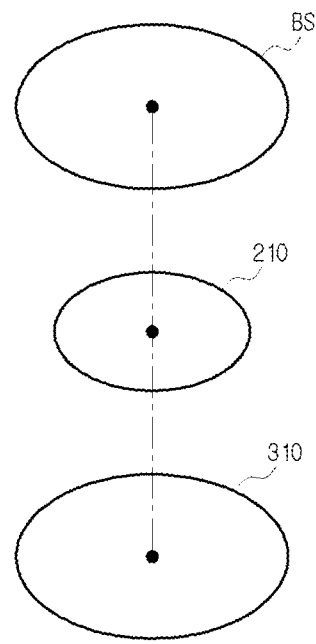
FIG. 5 is a schematic view illustrating a positional relationship between a bottom face of a first metal nanoparticle, a cross-section of a support body, and an outer circumferential surface of the penetrating pore of the second metal film.

FIG. 5 illustrates an example of the bottom face BS of the first metal nanoparticle, a cross-section 210 of the support body, and an outer circumferential surface 310 of the penetrating pore of the second metal film 300.

As in the example illustrated in FIG. 5, the cross-section 210 of the support body may have a shape corresponding to the shape of the bottom face BS. In detail, the cross-section 210 of the support body may have a shape corresponding to the shape of the bottom face BS regardless of position of the cross-section. Here, the cross-section 210 of the support body may refer to a cross-section perpendicular to a longitudinal direction of the support body. In detail, the cross-section 210 of the support body may refer to a cross-section perpendicular to the above-described projection direction, and more specifically, the cross-section 210 of the support body may refer to a horizontal cross-section of the support body.

In detail, the cross-section 210 of the support body may have a shape substantially the same as the shape of the bottom face BS, but the shape thereof may be reduced in size. A reduction ratio may be defined as $R_1/R_0*100(\%)$ when a radius of a circle when the area of the bottom face BS is changed into a circle having the same area is $R_0$ and a radius of the circle when an area of a cross-section of a region of the support body in contact with or adjacent to the first metal nanoparticle is changed into a circle having the same area is $R_1$. Here, the reduction ratio ($R_1/R_0*100$) may be a ratio causing $(\pi R_0^2)*100(\%)$, that is, an area of the support body in contact with the bottom face $(\pi R_1^2)$/area of the bottom face $(\pi R_0^2)*100(\%)$, to be 10% to 80%, preferably, 30% to 80%, and more preferably, 40% to 80%.

The cross-section 210 of the support body has substantially the same shape as the shape of the bottom face BS but the shape has a reduced size. When the structure is described in the aspect of a manufacturing method, such a structure is obtained by forming a material for forming the support body in the form of a film (which may correspond to a compound film as described hereinafter) on an upper portion of a base substrate, forming a first metal nanoparticle on the film (compound film), and isotropic-etching the film (compound film) using the formed first metal nanoparticle as an etching mask. Through the isotopic etching using the first metal nanoparticle as an etching mask, a floating-type first metal nanoparticle having the aforementioned empty space E and supported by the support body may be manufactured. Here, isotropic-etching including wet etching does not have directionality, and etching is performed uniformly in all the directions. Accordingly, when the film having the same material as that of the support body is etched, it is etched in a thickness direction and etching may be equally performed on a lower portion of the first metal nanoparticle (etching mask) omnidirectionally. Accordingly, the first metal nanoparticle may be supported by the support body and have the floating structure, and a cross-section of the support body may have a shape corresponding to the shape of the bottom face BS.

As described above, the shape of the penetrating pore PP may correspond to the projected shape of the first metal nanoparticle 100, and at the same time, the cross-section 210 of the support body 200 may have a shape corresponding to the shape of the bottom face BS.

In a specific example, when the first metal nanoparticle the truncated sphere shape, the penetrating pore PP, the cross-section of the support body, and the bottom face may have a circular shape. The penetrating pore PP may have a shape corresponding to the bottom face of the first metal nanoparticle or the cross-section of the first metal nanoparticle traversing the center of the truncated sphere of the first metal nanoparticle. Also, the cross-section of the support body may have a size reduced in the bottom face and the shape of the bottom face.

Also, as in the example illustrated in FIG. 5, the first metal nanoparticle, the penetrating pore, and the support body may have a concentric structure with each other. This may be understood with reference to the above-described contents in the aspect of the manufacturing method in relation to the cross-sectional shape of the support body and the shape of the penetrating pore.

In detail, since the penetrating pore is formed using the first metal nanoparticle as a deposition mask and the support body supporting the first metal nanoparticle in a floating manner through isotropic etching using the first metal nanoparticle as an etching mask, the first metal nanoparticle, the penetrating pore, and the support body may have a concentric structure.

Referring to FIG. 5, the center of the bottom face BS of the first metal nanoparticle, the center of the cross-section 210 of the support body at a certain position of the support body, and the center of the outer circumferential surface 310 of the penetrating pore of the second metal film 300 may have a concentric structure forming a single axis (indicated by the dotted line in FIG. 5).

Figure 6:
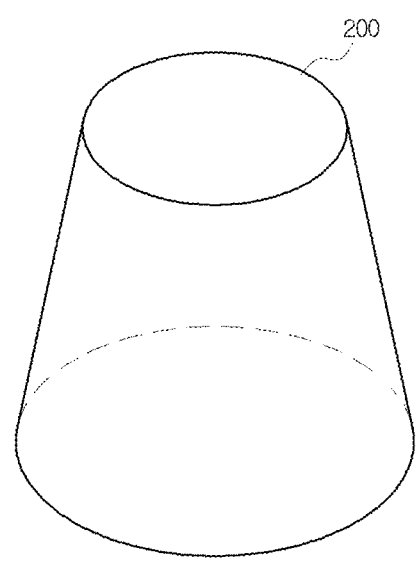
FIG. 6 is a perspective view illustrating only a support body for supporting a first metal nanoparticle.

FIG. 6 is a perspective view illustrating only the support body 200 supporting the first metal nanoparticle 100. As in the example of FIG. 6, the support body 200 may have a cross-sectional shape corresponding to the bottom face of the first metal nanoparticle 100.

Assuming that a side of the support body in contact with the first metal nanoparticle 100 is an upper side and a side opposing the upper side is a lower side, a cross-section of the upper side may be smaller than that of the lower side. In detail, the cross-section of the support body 200 may be increased in a direction from the upper side to the lower side, and may be continuously increased. Also, a side surface of the support body 200 may be flat or curved, and the curved face may be a concave curved face.

When described in the aspect of the manufacturing method, the support body may be formed by isotropic etching the film of the support body material using the first metal nanoparticle as an etching mask. Accordingly, although etching is performed for a predetermined time, the upper side of the support body may be exposed to an etching solution for a longer period of time, while the lower side of the support body may be exposed to the etching solution for a shorter period of time. Also, since a length of the support body is realized in a few to hundreds of nanometer order, a curved side surface based on isotropic etching may not be apparent but the support body may have a concave curved side surface due to the isotropic etching characteristics.

The empty space E (analysis space) formed below the first metal nanoparticle on the basis of the above-described bottom face of the first metal nanoparticle, the shape of the support body, the cross-sectional shape thereof, and the shape of the penetrating pore may have a tapered hollow container shape tapering in width downwards. Here, in defining the empty space, the expression of 'hollow' may refer to a space (space of the support body) which is not substantially empty.

When the first metal nanoparticle has a truncated sphere shape, the empty space E (analysis space) may have a tapered hollow cylindrical shape with a width tapered downwards. As described above, a detection target may be located in the empty space. SERS intensity is significantly affected by positions of the detection target and the hot spot, as well as SERS activity of the substrate itself. Hot spots are formed between the surface of the first metal nanoparticle including an edge of the bottom face of the first metal nanoparticle and the surface of the second metal film including an edge of the penetrating pore of the second metal film and the pore face of the penetrating pore. In a specific example, in case where the first metal nanoparticle has a truncated sphere shape, hot spots having a circular closed-loop shape may be formed. As a detection target is positioned in the fine empty space E demarcated by the first metal nanoparticle and the second metal film forming the hot spot having the closed-loop shape, SERS intensity may be significantly increased, and since the empty space includes the hot spot and a shape of the cross-section of the empty space and a shape of the hot spot are equal, detection sensitivity and detection reliability (reproducibility) may be enhanced.

Figure 7:
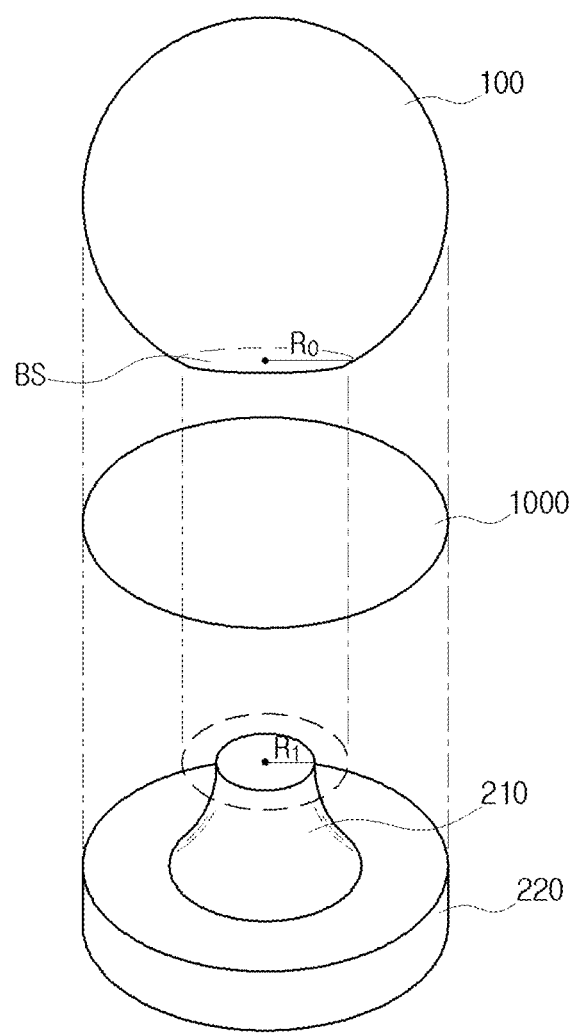
FIG. 7 is a perspective view illustrating a support body including an upper support region and a lower support region.

FIG. 7 is a perspective view of a support body 200 having a step, specifically, the support body 200 including an upper support region 210 and a lower support region 220 and having a step between the upper support region 210 and the lower support region 220. In the example of FIG. 7, the upper support region 210 may correspond to the support body described above with reference to FIGS. 1 to 6, and the lower support region 220 may have a diameter greater than that of the upper support region and have a columnar shape including a cylinder forming a step with the upper support region 210. As illustrated in FIG. 7, both shapes of the upper support region 210 and the lower support region 220 may be defined by the first metal nanoparticle 100. For better understanding of the shape relationship between the first metal nanoparticle 100 and the support body 200, the first metal nanoparticle 100, the bottom face BS of the first metal nanoparticle 100, and a projected shape 1000 of the first metal nanoparticle 100 are illustrated together.

As illustrated in FIG. 7, the shape of the cross-section (cross-section in the longitudinal direction) of the upper support region 210 may be a shape corresponding to the bottom face BS of the first metal nanoparticle 100, specifically, a reduced shape of the bottom face BS. Here, as described above, the reduction ratio may be defined as $R_1/R_0*100(\%)$. The above-described reduction ratio may have a deep correlation with the length of the upper support region 210. Specifically, when $R_e$ is defined as a difference between $R_1$ and $R_0$ (i.e., $R_1=R_0-R_e$), $R_e$ may have a direct relationship to the length of the upper support region 210. In a specific example, $R_e$ may be substantially equal to the length of the upper support region 210.

When this is described in the aspect of a manufacturing method, a material for forming the support body including the upper support region may be formed on a base substrate in the form of a film (which may correspond to a compound film), a first metal nanoparticle is formed on the film (compound film), and the film (compound film) is isotropic-etched using the formed first metal nanoparticle as an etching mask to prepare the upper support region 210. Since isotropic etching is etching without directionality, when etching is performed by a length of $R_e$ below the first metal nanoparticle as a mask, etching may also be performed by $R_e$ in a depth direction of the film. Accordingly, the length (height) of the upper support region 210 may be substantially equal to Re and may be substantially equal to $R_0-R_1$. Here, the 'being substantially equal' considers that etching rates in the lower side of the etching mask and in the depth direction of the film may be even slightly different according to an etching time due to kinetic conditions such as fluidity such as an etchant, an etching byproduct, and the like. Thus, it should be appreciated that when the etching length in the horizontal direction (etching to the lower side of the first metal nanoparticle) and the etching length in the vertical direction are equal, it considers (reflects) a difference based on kinetic variables during etching. Those skilled in the semiconductor fields that use wet etching to pattern a film or manufacture an element will be clearly aware of the substantial sameness.

Meanwhile, the shape of the cross-section (cross section in the longitudinal direction) of the lower support region 220, which is stepped with the upper support region 210, corresponds to the projected shape of the first metal nanoparticle 100. Specifically, the cross-sectional shape of the lower support region 220 may be substantially the same as the projected shape 1000 of the first metal nanoparticle 100. As described above, since the penetrating pores of the second metal film 300 may also have substantially the same shape as the projected shape of the first metal nanoparticle 100, the side surface of the lower support region 220 and the pore face of the penetrating pore of the second metal film 300 may be adjacent to each other.

When this is described in the aspect of the manufacturing method, since directional etching such as dry etching is performed, the film (compound film) located below the first metal nanoparticle is not etched, and the lower support region 220 corresponding to the projected shape of the first metal nanoparticle 100, substantially having the same cross-sectional shape as the projected shape of the first metal nanoparticle, may be manufactured. Here, the length (i.e., the depth etched by the directional etching) of the lower support region 220 may be appropriately adjusted and may be substantially, for example, 10 nm to 5 μm, but the present invention is not limited thereto. In case where the support body described above with reference to FIG. 7 is provided, a lower portion of the empty space may be defined by a step surface between the lower support region 220 and the upper support region 210. This means that the width of the empty space where a detection target is positioned and the depth of the empty space may be controlled independently of each other.

Figure 8:
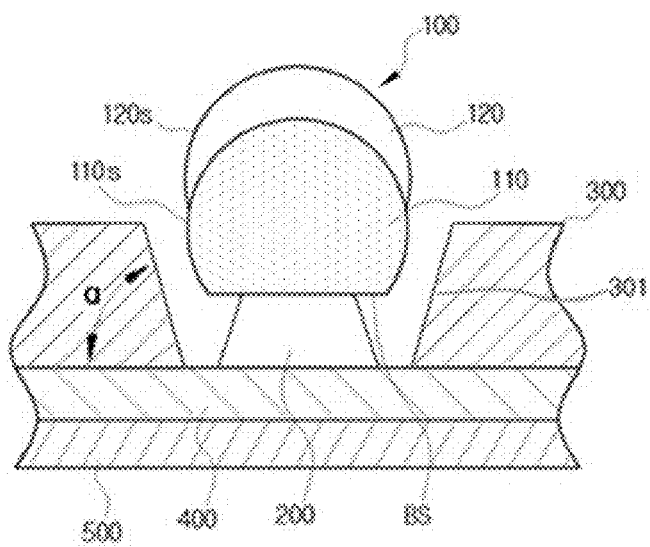
FIG. 8 is a cross-sectional view of a SERS substrate according to an exemplary embodiment of the present invention.

FIG. 8 is a cross-sectional view of a SERS substrate according to an exemplary embodiment of the present invention. As illustrated in FIG. 8, the substrate may further include a lower film 400 positioned below the second metal film 300 and the floating-type first metal nanoparticle 100. In other words, the SERS substrate may include a base substrate 500, the lower film 400 located on the upper side of the base substrate 500, the second metal film 300 formed on the upper side of the lower film 400 and having a penetrating pore, and the floating-type first metal nanoparticle 100 located in the penetrating pore of the second metal film 300, supported by the support body 200, and forming a nanogap with the second metal film 300.

In the example of FIG. 8, the lower film 400 may be a metal film (third metal film) or film formed of the same material as that of the support body 200.

Specifically, when the lower film 400 is formed of the same material as the support body 200, the support body 200 may extend from the lower film 400. The support body 200 extending from the lower film 400 means that the support body 200 and the lower film 400 are physically integral and the support body 200 may be interpreted as a protrusion of the lower film 400. When this is described in the aspect to the manufacturing method, the support body and the lower film integrated with the support body may be simultaneously manufactured by etching (wet etching or sequential etching of wet etching and dry etching) the film (compound film) of the material of the support body on which the first metal nanoparticle is formed to a predetermined depth using the first metal nanoparticle as an etching mask. Accordingly, the film remaining after the etching in the film (compound film) of the material of the support body may be defined as the lower film and the column below the first metal nanoparticle formed by etching may be defined as the support body. In case where the lower film 400 is a film of the same material as that of the support body 200, the lower film may be formed of a material of one or two or more selected from among a metal compound and a semiconductor compound described hereinafter. Here, a thickness of the lower film is not particularly limited but may be 10 nm to 300 nm.

However, the present invention is not limited to the case where the support body 200 and the lower film 400 are formed of the same material. For example, after a multilayer film in which the lower film and the film of the material of the support body are stacked is manufactured, a first metal nanoparticle may be formed on the multilayer film, and the film of the material of the support body may be selectively etched to be removed using the first metal nanoparticle as a mask, thus forming a support body on the lower film formed of a heterogeneous material different from the support body. Accordingly, the support body and the lower film may be different materials.

Specifically, the support body may be one or two or more selected from among a metal compound and a semiconductor compound, and independently thereof, the lower film may be one or two or more selected from among a metal, a metal compound, and a semiconductor compound. Advantageously, as an example of the lower film of a material different from the support body, the lower film may be a metal film. When the lower film is a metal film, distribution of light on the substrate may be controlled, which is more advantageous. Specifically, in the Raman scattering substrate, surface-enhanced Raman scattering light by hot spots in the substrate is spread in both upper and lower directions (in all directions). However, in case where the lower film is a metal film, Raman scattering light is prevented from traveling in a downward direction of the substrate and most of the Raman scattering light enhanced in the hot spot may be controlled to be spread in the upward direction of the Raman scattering substrate, thus minimizing loss of light. In case where the lower film is a metal film, a metal of the metal film as the lower film may be an alkali metal, a transition metal, a post-transition metal, a metalloid, or an alloy thereof. The thickness of the metal film as the lower film is not particularly limited but may be 10 nm to 300 nm, and is advantageously 50 nm to 300 nm in terms of effectively preventing light spreading to a lower side of the substrate.

When the substrate further includes the lower film as in the example of FIG. 8, a lower side of the empty space E (analysis space) may be demarcated by the lower film 400, rather than the base substrate 500. That is, in case where the support body is a support body not having a step as in the example of FIG. 6, the lower side of the empty space E may be demarcated by the base substrate 500 or the lower film 400, and in case where the support body is a support body having a step as in the example of FIG. 7, the empty space may be demarcated by an upper side face (step face) of the lower support region 200, irrespective of the presence of absence of the lower film 400.

A receptor specifically coupled to a detection target material may be formed in at least one component selected from the base substrate 500 region or the lower film 400 region demarcating the lower side of the empty space and the support body 200.

That is, the substrate may further include a receptor specifically binding to a detection target material, and the receptor may be formed at least on a surface of the base substrate positioned below the floating-type first metal nanoparticle, a surface of the lower film, an upper side face of the lower support region and/or a side surface of the support body. Here, the surface of the lower film located below the first metal nanoparticle or the surface of the base substrate may refer to a region of the lower film or a region of the base substrate not covered by the second metal film, i.e., exposed to a surface by the penetrating pore region of the second metal film.

Specifically, the receptor may be formed on a surface of the base substrate; the surface of the base substrate and a side surface of the support body; a surface of the lower film; the surface of the lower film and the side surface of the support body; an upper side surface of the lower support region; or the upper side surface of the lower support region and a side surface of the upper support region. The detection target material may be stably fixed to the empty space E (analysis space) described above by the receptor.

In the SERS substrate according to an exemplary embodiment of the present invention, the lower film and the support body may be optically transparent or opaque and may be electrically conductive or insulating, independently of each other. In detail, the support body may be one or two or more selected from among a metal compound and a semiconductor compound, and independently thereof, the lower film may be one or two or more selected from among a metal, a metal compound and a semiconductor compound. More specifically, the support body may be a material of one or two or more selected from among a metal compound and a semiconductor compound, and the lower film may be homogeneous material of the support body or a metal.

When the lower film is a metal film, the metal of the metal film may be an alkali metal, a transition metal, a post-transition metal, a metalloid, or an alloy thereof. Specifically, the metal of the metal film may be lithium, sodium, potassium, rubidium, beryllium, magnesium, calcium, strontium, barium, scandium, yttrium, lanthanum, titanium, zirconium, hafnium, vanadium, niobium, tantalum, chromium, molybdenum, tungsten, manganese, iron, ruthenium, osmium, cobalt, rhodium, iridium, nickel, palladium, platinum, copper, silver, gold, zinc, aluminum, gallium, indium, tin, lead, bismuth, silicon, germanium, antimony, tellurium, or an alloy thereof. The metal compound of the lower film or the support body may include a metal halide including a metal oxide, a metal oxynitride, a metal nitride, and a metal fluoride, a metal carbide, or a mixture, thereof, and the semiconductor compound may be one or two or more selected from among a semiconductor oxide, a semiconductor oxynitride, a semiconductor nitride, a semiconductor carbide, and a semiconductor material. Here, the metal of the metal compound may include a transition metal and a post-transition metal, and semiconductor of the semiconductor compound or the semiconductor material may include Group IV semiconductors such as silicon (Si), germanium (Ge), or silicon germanium (SiGe). More specifically, the metal compound and the semiconductor compound may include $ZrO_2$, $ZnO$, $YF_3$, $YbF_3$, $Y_2O_3$, $TiO_2$, $ThF_4$, $ThF_3$, $Ta_2O_5$, $GeO_2$, $TeO_2$, $SiC$, diamond, $SiO_xN_y$ (x is a real number and 0<x<2, y is a real number and 0<y<1.5), $SiO_2$, $SiO$, $SiN_x$ (x is a real number and 1≤x≤1.5), $Sc_2O_3$, $NdF_3$, $Na_3AlF_6$, $MgF_2$, $LaF_3$, $HfO_2$, $GdF_3$, $DyF_3$, $CeF_3$, $CaF_2$, $BaF_2$, $AlF_3$, $Al_2O_3$, indium-tin oxide (ITO), Al-doped zinc oxide (AZO), Ga-doped zinc oxide (GZO), indium-zinc oxide (IZO), or a mixture thereof.

In an exemplary embodiment of the present invention, an average diameter of a projected shape (an average diameter of a circle changed to a circle having the same area as the projected shape) of the first metal nanoparticle with respect to the projected shape may be 10 nm to 500 nm, and preferably, 50 nm to 250 nm. In case where the first metal nanoparticle has a truncated sphere shape, it may be interpreted that one side of a sphere having an average diameter of 10 nm to 500 nm, preferably, 50 nm to 250 nm, is cut. However, the present invention is not limited by the size of the first metal nanoparticle, and the size of the first metal nanoparticle may be a size advantageous for enhancing a plasmonic signal.

In an exemplary embodiment according to the present invention, the length of the support body may be adjusted in consideration of a length in which a lower face of the empty space E may be defined to be adjacent to hot spots as possible, while stably supporting the floating-type first metal nanoparticle, but is not particularly limited. This is because, in case where the support body includes an upper support region and a lower support region, lengths (heights) of the lower face of the empty space and the support body may be independently controlled of each other. In a substantial example, the length of the support body may be 5 nm to 1 μm, and, more substantially, 10 nm to 500 nm but is not limited thereto.

The size of the nanogap may be adjusted by adjusting the length of the support body itself if the support body does not have a step, or by adjusting the length of the upper support region or a thickness of the second metal film if the support body has a step. Since the size of the nanogap is controlled by simply adjusting the length of the support body or the thickness of the second metal film according to the technical concept of the present invention, the ultrafine nanogap may also be strictly formed and the nanogap which rarely has an error from a designed size may be formed. In terms of intensifying a plasmonic effect, the nanogap may be an ultrafine nanogap having a size of nanometer order ($10^0$ nm order) and may be an ultrafine nanogap specifically of 1 nm to 95 nm, more specifically, 1 nm to 50 nm, and even more specifically, 5 nm to 20 nm, but the present invention is not limited by the size of the nanogap. Here, the size of the nanogap may be defined as the shortest distance between the surface of the first metal nanoparticle including the bottom face edge of the first metal nanoparticle and the surface of the second metal film including the pore face of the penetrating pore of the second metal film. For example, in case where the first metal nanoparticle has a truncated shape in which a lower portion of the sphere is cut off or is a cut capsule type as illustrated in FIG. 3(a), a surface from the lower face edge of the first metal nanoparticle to a face (e.g., a central face of the sphere) having a maximum cross-sectional area is determined as a lower surface region of the first metal nanoparticle and the size of the nanogap may be defined as the shortest distance between the lower surface region of the first metal nanoparticle and the pore face of the penetrating pore of the second metal film.

The thickness of the second metal film may be controlled in consideration of the shape of the first metal nanoparticle, the length of the support body described above, and the designed nanogap size. Here, as in the example illustrated in FIG. 8, the pore face of the penetrating pore of the second metal film may be a sloped face and the thickness of the second metal film may be greater than the length of the support body, and this is because the projected shape of the first metal nanoparticle serves as a mask when the second metal film is manufactured.

In detail, when the second metal is deposited to form the second metal film as illustrated in FIG. 8, a portion of the second metal may also be deposited on the first metal nanoparticle acting as a mask. This may lead to an effect that the projected shape of the first metal nanoparticle acting as a mask is gradually increased as deposition of the second metal is in progress. Accordingly, as the manufacturing method described later, when the metal nanoparticle acting as a mask at the time when the second metal starts to be deposited a first metal nanoisland 110 and a portion deposited on an upper portion of the first metal nanoisland 110 through deposition of the second metal is a coating layer 120, the first metal nanoparticle 100 may be a truncated particle shape in which the first metal nanoisland 110 and the coating layer 120 are stacked. In detail, in case where the first metal and the second metal are the same, deposition proceeds, and the first metal nanoparticle may be changed to the truncated particle shape 100 having the bottom face BS, a lower surface 110s in contact with the bottom face and resulting from a curved face of the first metal nanoisland 110 used as a mask, and an upper surface 120s (which may have a curvature the same as or different from the lower surface) of the coating layer 120 formed as the first metal is deposited. Also, when the first metal and the second metal are different, deposition proceeds, and the first metal nanoparticle may have a truncated particle shape having the bottom face BS, a lower surface 110s in contact with the bottom face and resulting from a curved face of the first metal nanoisland 110 used as a mask, and the upper surface 120s in contact with the lower surface 110s and resulting from the curved face of the coating layer 110 of the second metal.

As the deposition of the second metal proceeds, the effect that the projected shape of the first metal nanoparticle acting as a mask is gradually increased is obtained so that a pore face 301 of the penetrating pore in the second metal film 300 may be formed as a tapered face. In detail, the pore face 301 may be formed as a tapered face such that the pore is increased toward the surface. In detail, lower portion of the penetrating pore may have a size corresponding to the projected shape of the first metal nanoparticle (first metal nanoisland described hereinafter) at the time of deposition of the second metal, and an upper portion of the penetrating pore may have a size corresponding to the projected shape of the second metal nanoparticle at the time of completion of the deposition of the second metal. As the projected shape of the nanoparticle acting as a mask is gradually increased according to deposition of the second metal, the pore face may be formed as the tapered face. A taper angle (α), which is an angle between the pore face and the substrate (or the lower film), may be 30° to 89°, specifically, 50° to 85°.

In the substrate for Raman scattering according to an exemplary embodiment of the present invention, a thickness of the second metal film may be adjusted to be less than a thickness at which the second metal film is not physically in contact with the first metal nanoparticle. In detail, a thickness t of the second metal film may be less than $t_o$ ($t_o$ is a thickness at which the second metal film and the first metal nanoparticle are in contact with each other), and the thickness of the second metal film may be controlled in consideration of a size of a designed nanogap under the condition less than $t_o$. In a substantial and non-limited example, the thickness of the second metal film may be 0.5 L to 5 L, more specifically, 0.5 L to 1.5 L, with respect to the length L of the support body, but is not limited thereto.

Preferably, the thickness of the second metal film may be equal to or greater than the length of the support body. That is, the thickness of the second metal film may be 1 L to 5 L, specifically, 1.1 L to 1.5 L, with respect to the length L of the support body. This means that the bottom face, which is a plane surface, of the first metal nanoparticle is present at a position which is the same as or lower than the surface of the second metal film and that the first metal nanoparticle is partially loaded inside the penetrating pore of the second metal film. In this case, hot spots are formed between a surface of the first metal nanoparticle loaded inside the penetrating pore and the pore face of the penetrating pore, and here, the hot spot is advantageously formed as a band-shaped closed loop having a predetermined width. The band-shaped hot spot may not only amplify a signal more strongly than in a line shape but also mitigate an influence of process errors that are inevitably caused by the limitations of a manufacturing process, further improving stability of the substrate.

In the SERS substrate according to an exemplary embodiment of the present invention, density of the nanostructures, which is the number of the first metal nanoparticles per unit area of the substrate, may be 1 to 400/μm², specifically, 10 to 100/μm², and more specifically, 15 to 100/μm². As the well-defined closed-curve type hot spot is formed by the first metal nanoparticle and the film of the second metal, the density of the nanostructures may be regarded as density of hot spots, which is the number of hot spots per unit area of the substrate. Sensitivity of detection may be remarkably improved by such a high-density nanostructures (hot spot density).

In the SERS substrate according to an exemplary embodiment of the present invention, the substrate may include a Raman scattering active region and a Raman scattering inactive region, and two or more Raman scattering active regions may be arranged to be spaced apart from each other.

In detail, the Raman scattering active region may be a region in which the floating-type first metal nanoparticle is formed and forms hot spots with the second metal film, and the Raman scattering inactive region may be region in which the floating-type first metal nanoparticle is not formed. Here, the second metal film may be formed or not formed in the Raman scattering inactive region.

That is, the SERS substrate may be a multiplexing substrate in which different detection targets may be simultaneously detected and analyzed through the single substrate by the two or more Raman scattering active regions arranged to be spaced apart from each other. Here, different receptors may be formed in the empty space E (analysis space) in Raman scattering active regions, respectively.

The detection target is not particularly limited and may be typically a biochemical material. The biochemical material may include a cell constituent material; a dielectric material;

a carbon compound; a material that affects the metabolism of an organism; a material that affects synthesis of a material of an organism; a material that affects material transport or a signal transmission process of an organism; and the like. In detail, the biochemical material may be a polymer organic substance, an organic metal compound, a peptide, a carbohydrate, a protein, a protein complex, a lipid, a metabolite, an antigen, an antibody, an enzyme, a substrate, an amino acid, an aptamer, sugar, a nucleic acid, a nucleic acid fragment, a peptide nucleic acid (PNA), a cell extract, or a combination thereof.

Specific binding between a receptor and a detection target includes an ionic bond, a covalent bond, a hydrogen bond, a coordinate bond, or a non-covalent bond, and in a non-limited and specific example, the receptor may be a material which can specifically bind to a detection target through a complementary bond between an enzyme and a substrate, between an antigen and an antibody, between proteins, or between DNAs, and the like.

In the conventional sensor field for detecting a detection target containing a biochemical substance, the receptor may be any substance known to specifically bind to a detection target so as to be used for fixing the detection target to one region of a sensor.

In a specific and non-limited example, the receptor may include at least a self-assembled monolayer (SAM) self-assembled to the surface of the lower film and/or the side surface of the support body forming the empty space E.

The SAM may include a chain, a first functional group which is one end functional group of the chain, and a second functional group which is another end functional group of the chain. The first functional group may be a functional group that spontaneously binds to a base substrate, and the second functional group may be a functional group that specifically binds an analysis target material. Self-assembly may be accomplished by appropriately designing a material of base substrate and the first functional group of the SAM, and a set of functional groups per materials of a base substrate that are commonly known to be self-assembled (self-bound) may be used. In a specific example, the first functional group may be a thiol group (—SH), a carboxyl group (—COOH), or an amine group (—NH2). A typical base substrate material that spontaneously binds to the thiol group and/or the amine group may include a metal oxide such as Au oxide, Ag oxide, Pd oxide, Pt oxide, Cu oxide, Zn oxide, Fe oxide, In oxide, and the like, and Si, $SiO_2$ (including amorphous glass), indium tin oxide (ITO), and the like. A typical base substrate that spontaneously binds to the carboxyl group may include $SiO_2$, $TiO_2$, $SnO_2$, Zn oxide, and the like. The chain of the SAM includes an alkane chain, specifically, an alkane chain of C3-C20. By adjusting a chain length of the SAM, the detection target binding to the second functional group may be introduced to the hot spot. That is, by adjusting the length of the receptor formed in the empty space, a position of the detection target that binds to the receptor on hot spots basis may be adjusted.

The second functional group may be a functional group such as a thiol group, a carboxyl group, or an amine group, similarly to the first functional group described above, but is not limited thereto. The second functional group may include an enzyme, a substrate, an antigen, an antibody, a protein, DNA, etc., bound to an end of a chain through the functional group such as the thiol group, the carboxyl group, or the amine group, which is a known to a person skilled in the art of detecting a biochemical material.

The base substrate 500 may be a material which serves as a support and which is thermally or chemically stable. In the macroscopic shape, the base substrate 500 may be in the form of a wafer or a film, and may have a concavo-convex structure on a surface thereof in consideration of a purpose thereof such as a recess structure as well as a flat planar base substrate. Materially, the base substrate may be a semiconductor or a ceramic. A non-limited example of semiconductor base substrate may be a multilayer body formed by stacking a Group IV semiconductor including silicon (Si), germanium (Ge), or silicon germanium (SiGe); Group III-V semiconductors including gallium arsenide (GaAs), indium phosphide (InP), or gallium phosphide (GaP); Group II-VI semiconductors including cadmium sulfide (CdS) or zinc telluride (ZnTe); Group IV-VI semiconductors including lead sulfide (PbS); or two or more selected from these materials. A non-limited example of the ceramic base substrate may be a multilayer body formed by stacking a semiconductor oxide, a semiconductor nitride, a semiconductor carbide, a metal oxide, a metal carbide, a metal nitride, or two or more selected from the materials. Here, semiconductor of the semiconductor oxide, the semiconductor nitride, or the semiconductor carbide may include a Group IV semiconductor, Group III-V semiconductors, Group II-VI semiconductors, Group IV-VI semiconductors, or a mixture thereof.

The present invention includes an element for detecting a molecule including the SERS substrate described above. Here, the molecule may include the biochemical material described above.

In a specific example, the element for detecting a molecule according to an exemplary embodiment of the present invention may include the SERS substrate described above, a floating-type first metal nanoparticle on the SERS substrate, a support body supporting the first metal nanoparticle, and a microfluidic channel forming a nanogap with a first metal nanoparticle of at least a second metal film and formed to accommodate a region surrounding the circumference of the first metal nanoparticle therein.

In a specific example, the element for detecting a molecule according to an exemplary embodiment of the present invention may include the SERS substrate described above, a floating-type first metal nanoparticle on the SERS substrate, a support body supporting the first metal nanoparticle, and a well forming a nanogap with a first metal nanoparticle of at least a second metal film and formed to accommodate a region surrounding the circumference of the first metal nanoparticle therein.

The present invention includes a method for manufacturing the above-described SERS substrate.

In detail, a method for manufacturing a surface enhanced Raman scattering (SERS) substrate includes: a) forming a compound film as a metal compound or a semiconductor compound on a base substrate; b) forming a first metal film on the compound film and performing a heat treatment thereon to prepare first metal nanoislands positioned to be spaced apart from each other on the compound film; c) isotropic-etching the compound film to a predetermined depth using the first metal nanoislands as an etching mask; and d) depositing a second metal on the etched compound film using the first metal nanoislands as a deposition mask to form a second metal film. Here, the floating-type first metal nanoislands may be manufactured by the etching of operation c), and a floating-type first metal nanoparticle in which the second metal is deposited at an upper portion of the floating-type first metal nanoislands and the second metal film surrounding the first metal nanoparticle may be manufactured by operation d).

That is, in the manufacturing method according to the present invention, the high-quality SERS substrate in which sizes of hot spots, shapes of hot spots, positions of hot spots, and the like, are precisely controlled, a Raman scattering signal is remarkably increased by the ultrafine nanogap, and a uniform SERS activity is obtained even in a large area may be manufactured through the very simple, low-priced large-area manufacturing process of etching-deposition including deposition-heat treatment-isotropic etching.

In detail, in case where a nanogap is formed between the nanostructures using a lithography as in the related art, controlling may be performed precisely, but the use of high-priced equipment and mask incurs a high process establishing and manufacturing cost, makes it difficult to maintain and manage the process, and degrades design flexibility as a high-priced new mask set is required to be implemented when a nanogap, or the like, is intended to be changed.

In addition, formation of metal nanoparticles using liquid phase reduction or deposition may be a low-priced process, but since nanogaps are formed by metal nanoparticles formed in various sizes at random positions, the size of nanogaps may not be precisely controlled, and a distribution of nanogaps is so wide that signal enhancement is relatively weak, quantitative analysis is difficult, and reproducibility is low.

The manufacturing method according to the present invention overcomes the limitations of the related arts, and it is possible to strictly control the size of nanogaps while using a very inexpensive and simple process, and a substrate having very uniform nanogaps may be manufactured even with a large area.

In an exemplary embodiment according to the present invention, a) forming of a compound film on the base substrate may be performed through physical deposition such as sputtering or chemical deposition such as plasma assisted chemical vapor deposition, or the like, and this is known to the person in the art of forming a film having a predetermined thickness through deposition. In the etching including isotropic etching in operation c), if etching is performed such that the compound film remains, the compound film formed on the base substrate in operation a) may be changed to a support body and a lower film of the substrate for Raman scattering described above through etching including the isotropic etching in operation c). In this case, a thickness of the compound film may correspond to a thickness corresponding to the sum of the length of the support body and the thickness of the lower film described above.

However, the present invention is not limited to that the lower film and the support body are the same material. An operation of forming a lower film which is a metal film on the base substrate before operation a) or which is a film (second compound film) of a metal compound or a semiconductor compound different from the compound film (first compound film) of step a) may be further performed, and the lower film may be exposed to a surface in a region not protected with the etching mask by etching including the isotropic etching of operation c). In this case, a lower film of the exposed metal film or the second compound film may be manufactured.

Specifically, in case where the support body and the lower film are different compounds (metal compounds or semiconductor compounds), multilayer films may be formed by stacking the second compound film as a material of the lower film and the first compound film as a material of the support body on the base substrate before operation b). In the case of the multilayer films, a thickness of the second compound film may be the thickness of the lower film described above, and a thickness of the first compound film may correspond to the length of the support body described above.

In detail, in case where the lower film is a metal film, which is an advantageous example, forming a metal film on the base substrate may be further performed before the formation of the compound film in operation a). That is, the manufacturing method according to an exemplary embodiment of the present invention may include: forming a metal film on a base substrate; and forming a compound film on the metal film. The metal film may also be formed through the general deposition such as physical deposition such as sputtering, chemical deposition such as plasma assisted chemical vapor deposition, and the like. In case where the lower film (metal film) and the compound film are sequentially formed before operation b), the compound film may be changed into a support body by the etching including the isotropic etching in operation c) and the metal film may be exposed to the surface in a region not protected by an etching mask. That is, the compound film region positioned below the etching mask may be changed into the support body by the etching including the isotropic etching in operation c) and the compound film region excluding the region below the etching mask is entirely removed so that the metal film may be exposed to the surface. Accordingly, the depth (etching depth) removed by the etching including the isotropic etching in operation c) may correspond to the thickness of the compound film. In case where the lower film (metal film) and the compound film are sequentially formed before operation b), the thickness of the metal film on the base substrate may be the thickness of the lower film described above and the thickness of the compound film may correspond to the length of the support body described above.

In operation b), after the first metal film is formed on the compound film, the first metal film is heat-treated to manufacture the first metal nanoislands. The first metal film may also be formed through physical deposition such as sputtering, chemical deposition such as plasma assisted chemical vapor deposition, and the like, which is a technique well known to those skilled in the art for forming a film having a certain thickness through deposition.

The thickness of the first metal film formed on the compound film may be 50 nm or less, specifically, 1 to 50 nm, more specifically, 1 to 30 nm, and even further specifically, 5 to 20 nm. If the thickness of the first metal film is too thin, there is a risk that the size of the first metal nanoisland formed by the heat treatment becomes too small. Also, if the thickness of the first metal film is excessively large, there is a risk that a porous film, rather than a nanoisland, may be formed or coarse particles may be produced although nanoparticles are formed.

Figure 9:
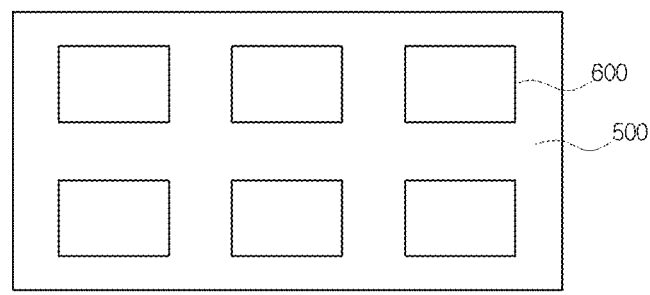
FIG. 9 is an example illustrating a first metal film patterned in a square pattern forming a 2×3 matrix on a base substrate.

In order to manufacture a multiplexing substrate in which different detection targets are detected from the single substrate or in order to manufacture a plurality of SERS substrates using a single base substrate, a patterned first metal film may be formed on the compound film. The patterned first metal film is intended to form the above-described SERS active region. The patterned first metal film having a shape corresponding to a pre-designed SERS active region and a pattern corresponding to an arrangement of the pre-designed SERS active region may be formed on the compound film. In a specific and non-limited example, the patterned first metal film may be quadrangular or circular patterns arranged to be spaced apart from each other to form an M×N (M is a natural number of 1 or greater and N is a natural number of 2 or greater) matrix. FIG. 9 illustrates an example of a first metal film 600 patterned in a square pattern forming a 2×3 matrix on a base substrate. A portion where the first metal film 600 is not formed on the base substrate may correspond to the above-described SERS inactive region.

A heat treatment for forming nanoislands may be performed by a rapid thermal process (RTP). Here, in a state in which the shape of the first metal film, which is a thin film having a uniform thickness, is entirely maintained, when first metal atoms forming the first metal film are instantly diffused by thermal energy, nanoislands having a uniform size may be manufactured. Here, RTP may be performed using general RTP equipment heated by light such as tungsten-halogen lamp.

A heat treatment temperature for forming nanoislands may be $0.3T_m$ to $0.9T_m$, specifically $0.5T_m$ to $0.8T_m$, with respect to $T_m(°C.)$ which is the melting point of the first metal. The above-mentioned temperature is a temperature advantageous for uniform formation of fine nanoislands.

The heat treatment time may be a time for material to be sufficiently diffused so that the nanoislands of the first metal are formed with reproducibility. The heat treatment time may be varied to some extent according to the thickness of the first metal film. In a specific example, the heat treatment time may be 1 second to 5 minutes. A heat treatment atmosphere may be performed in a vacuum under air or inert atmosphere, but the present invention is not limited to the heat treatment time or the heat treatment atmosphere.

In an exemplary embodiment of the present invention, density of the finally obtained first metal nanoislands may be increased by repeating the above-described formation of the first metal film and the above-described heat treatment for forming the nanoislands. Through this repetition, the density of the nanoislands may be significantly increased without substantially increasing a size distribution of the nanoislands. When the formation of the first metal film and the heat treatment for forming the nanoislands are repeated, the first metal changed into nanoislands by a previous operation (heat treatment operation) is almost lost in driving power thereof, but the first metal film newly formed on the compound film has a sufficient driving force for forming particles, and thus, when the heat-treatment is repeatedly performed, nanoislands having a size similar to that of the already formed nanoislands may be newly formed in a region where a nanoisland is not formed.

Again, in operation b), by repeatedly performing operation b1) of forming the first metal film and operation b2) of performing the heat treatment, as a unit process, the density of the first metal nanoislands (the number of first metal nanoislands per unit area) on the compound film may be increased. The unit process may be repeated 2 to 4 times, but the number of repetition times may be appropriately adjusted in consideration of the density of the first metal nanoislands to be manufactured. In this case, the thickness of the first metal film repeatedly formed in terms of unit process is independently 30 nm or less, specifically, 5 to 15 nm, to form a very thin first metal film.

By repeating the above-described heat treatment or the above-described unit process, extremely high density nanoislands of $10/\mu m^2$ or more, specifically, $40/\mu m^2$ or more, may be formed on the metal compound film.

The first metal nanoisland produced through the heat treatment of the first metal film may have a truncated particle shape including a bottom face as a plane (interface between the nanoisland and the compound film) and a surface as a convex curved face, and an average diameter of the first metal nanoislands with respect to a projected shape may be 10 nm to 500 nm, preferably, 50 nm to 250 nm. However, the present invention is not limited by the size of the first metal nanoisland, and the size of the first metal nanoisland may be a size advantageous for enhancing a plasmonic signal.

In an exemplary embodiment according to the present invention, the etching in step may include isotropic etching. Here, the isotropic etching may be wet etching. That is, operation c) may include wet-etching the compound film to a certain depth using the metal nanoislands obtained in operation b) as an etching mask. In the etching in operation c), the compound film may be etched such that an area of 10% to 80%, preferably, 30% to 80%, more preferably, 40% to 80% thereof, with respect to an area of the bottom face of the first metal nanoisland (interface between the nanoisland and the compound film before etching) forms an interface with the support body. Here, as described above, when a metal film is formed below the compound film and the metal film is intended to be exposed to the surface by wet etching, a predetermined depth (etching depth) to be wet etched may correspond to the thickness of the compound film.

Since the wet etching is a non-directional isotropic etching, the floating-type first metal nanoisland may be manufactured by the wet etching in the operation c) and an empty space E (analysis space) may be formed below the nanoisland.

The support body described above with reference to FIGS. 1 to 6, that is, the support body without a step, may be manufactured through wet etching, and in the case of the support body with a step described above with reference to FIG. 7, the upper support region may be manufactured through wet etching.

Hereinafter, a case where isotropic etching including wet etching is performed in operation b) and a case where directional etching including dry etching and wet etching are performed in combination will be described in detail, respectively.

In case where a support body without a step is intended to be manufactured, the compound film may be wet-etched using the first metal nanoisland obtained in operation b) as an etching mask, thereby forming a support body supporting the first metal nanoisland and a lower film (metal film or a compound film remaining after etching) may be manufactured at the same time.

Specifically, during wet etching, an area of 10% to 80% with respect to the area of the bottom face of the first metal nanoisland (interface between the first metal nanoisland and the compound film in operation b) may be etched to a depth for forming an interface with the support body or may be etched to a depth satisfying the aforementioned reduction ratio. In an example, the compound film may be etched away to a depth of 5 nm to 200 nm, whereby a support body having a length of 5 nm to 200 nm may be manufactured. At the same time, the compound film remaining after the etching may form the lower film, or a metal film exposed to the surface as the compound film (the compound film having a thickness corresponding to the designed length of the support body) is removed by etching may form the lower film.

As all of the first metal nanoislands present on the substrate are located on a well-defined plane of the surface of the compound film, the bottom faces of the first metal nanoislands floating after etching may be located on a single virtual well-defined plane which was a surface of the compound film before etching.

Wet etching may be performed using a well-known etching solution, depending on a material of the compound film. In a specific example, the etching solution may contain an etchant which is sulfuric acid, nitric acid, boric acid, hydrogen fluoride, phosphoric acid, hydrochloric acid, or a mixed acid thereof, which, however, may be varied depending on a material to be removed. In a substantial example, if a compound film to be etched is an oxide film containing silicon oxide, the etchant of the etching solution may be a mono-acid of hydrogen fluoride or a mixture of hydrogen fluoride and nitric acid. In a substantial example, when a compound film to be etched is a nitride film including silicon nitride, the etchant of the etching solution may be mono-acid or a mixture of phosphoric acid and hydrochloric acid, but the present invention is not limited to the etching solution.

Dry etching is directional etching and may etch away a region that is not screened by a mask as a metal nanoparticle. Dry etching may include plasma etching in which a gas containing a halogen element such as fluorine is made into plasma to etch an etching target. Depending on a substance of the compound film, a well known dry etching method may be used. By dry etching performed after wet etching, the support body including the upper support region and the lower support region and the lower film (remaining compound film or metal film after dry etching) as illustrated in FIG. 7 may be formed. Here, if the lower film is a metal film, the compound film in operation a) may have a thickness corresponding to the sum of the designed length of the upper support region and the designed length of the lower support region. Alternatively, if the lower film is a compound film remaining after dry etching, the compound film in operation a) may have a thickness corresponding to the sum of the designed length of the upper support region, the designed length of the lower support region, and the designed thickness of the lower film.

After etching is performed, an operation of depositing a film of the second metal using the first metal nanoisland floated by the support body as a deposition mask may be performed. The second metal film may be deposited by physical deposition such as sputtering, or the like, or chemical deposition such as plasma assisted chemical vapor deposition. Preferably, the second metal film may be formed through directional deposition including thermal evaporation or e-beam evaporation. Through the directional deposition and using the floating-type first metal nanoisland having the bottom face of the plane as a deposition mask, adhesion and formation of the nanoparticles of the second metal on the side surface of the support body may be prevented.

As described above, when the second metal is deposited, directional deposition is performed on the second metal in the form of a film to have a uniform thickness on the base substrate using the floating-type first metal nanoisland as a deposition mask, and thus, the size of the nanogap may be precisely adjusted and the nanogap may be formed in a self-aligning manner at the same time when the first metal nanoparticles and the second metal film are formed. Also, the deposition mask using the first metal nanoisland and the directional deposition prevent formation of the second metal of the particle shape on the side portion of the support body, and thus, only ultrafine nanogap controlled according to a design may be prevented on the substrate. The nanogaps caused by the random particles (second metal particles) adhered to the side portion of the support body are formed as gaps having random sizes. In the presence of such random-sized gaps, it is substantially difficult to perform quantitative analysis of a material using Raman scattering.

However, in the manufacturing method according to the exemplary embodiment of the present invention, the nanoparticles of the second metal may not be formed on the side surface of the support body under the metal nanoparticles due to the directional deposition and the structure of the floating-type metal nanoparticles, which means that there is only a nanogap having a controlled size on the substrate for Raman scattering.

The first metal nanoparticle as the first metal nanoisland obtained after deposition is performed in operation d) may have a shape in which the first metal nanoisland used as a mask is slightly increased in a surface curvature in a deposition direction or slightly elongated in the deposition direction, when the second metal and the first metal are the same. Also, when the second metal is different from the first metal, the first metal nanoparticle may correspond to the stacking type particle described above. In detail, when the second metal is the same as the first metal, the first metal nanoparticle may have a truncated particle shape having a bottom face as a plane and a surface of a convex curved face, and the truncated particle shape may be a truncated sphere shape or a truncated capsule shape. When the second metal and the first metal are different, the aforementioned stacking type particle, as the first metal nanoparticle, including first metal nanoisland (particle of (1-1)-th metal described above) including the bottom face as a plane and the convex curved face and a coating layer of the second metal (coating layer of (1-2)-th metal described above) stacked to cover at least a portion of the convex curved face of the first metal nanoisland may be manufactured. Here, the first metal and the second metal may independently be silver, gold, platinum, palladium, nickel, aluminum, copper, chromium, or an alloy thereof.

High density nanoparticles may be formed on the substrate, and a distribution of the nanoparticles may be uniformly maintained even on a substrate having a large area. Since the substrate according to the manufacturing method according to the present invention has only the uniform distribution of nanoparticles and the precisely controlled nanogaps, the enhanced intensity of SERS average in area is uniformly maintained even in a large substrate, and thus, quantitative analysis may be performed on an analysis target material.

The thickness of the second metal film may be 5 to 100 nm, and may be adjusted in consideration of a designed nanogap size.

As described above, when the second metal is deposited, the second metal is deposited in a film form so as to have a uniform thickness on the base substrate using the floating-type metal nanoislands as a deposition mask and using directional deposition, whereby the size of the nanogap may be precisely controlled, the hot spot may be formed in a self-aligning manner simultaneously with the formation of the first metal nanoparticle and the second metal film, and furthermore, it is possible to prevent the nanoparticles causing an uncontrollable gap from being formed on the side portion of the support body.

It is also possible to adjust the size of the nanogaps formed in a self-aligning manner in operation d) by controlling at least one factor of the depth at which the compound film is etched during isotropic etching in operation c) and the thickness of the second metal film during deposition in operation d).

After etching is performed, forming a receptor that specifically binds to a detection target on the bottom face of the empty space defining a lower portion of the empty space E and/or the surface (including side surface) of the support body may be further performed before or after formation of the second metal film. Here, the bottom face of the empty space may be the surface of the base substrate, the upper surface of the lower support region, the surface of the metal film exposed to the surface after etching in operation c), or the surface of the compound film remaining after etching in operation c).

Preferably, after formation of the second metal film, forming a receptor that specifically binds to a detection target on the surface of the lower film (the metal film or the compound film remaining after the etching) demarcating the empty space, the upper surface of the lower support region and/or the side surface of the support body may be further performed. Such receptor formation may be accomplished by introducing a solution containing the receptor into the empty space so that the receptor is chemically bonded and fixed to the dielectric support body and the lower film. However, any method for attaching a receptor that is commonly used in a sensor field for detecting a biochemical material may be used, and the present invention is not limited to the specific method for forming a receptor.

In the above-described manufacturing method, a material of the first metal; a material of a second metal; a size, bottom face, shape or structure of the first metal nanoparticle (nanoparticle or first metal nanoisland); a material of the support body and a size and shape of the support body; a material and thickness of the lower film; a substance to be analyzed; a receptor material; a base substrate material or shape, etc., may refer to the contents of the substrate for Raman scattering described above and include all of the contents described in the substrate for Raman scattering.

FIG. 10(a) is a scanning electron microscope (SEM) photograph illustrating observation of a sample in which a silicon oxide layer having a thickness of 100 nm was formed on a base substrate of a silicon wafer of 2 cm×2 cm and an Ag film of 11 nm was formed on the silicon oxide layer, and FIG. 10(b) is a photograph of an SEM observing a sample manufactured using RTP equipment (Korea vacuum, KVR-020), which was heated for one minute after a temperature was raised up to 400° C., which is a heat treatment temperature, at a heating rate of 15° C./sec.

As can be seen from FIG. 10(b), it can be seen that the truncated particle type Ag nanoparticles are well formed on the silicon oxide layer, and the Ag nanoparticles having a size of 120 nm on average with respect to the projected shape are formed with high density up to 15/μm².

FIG. 11(a) shows a sample in which a silicon oxide layer was wet-etched to a depth of 20 nm using an etching solution HF:NH$_4$F 1:6 (v/v) using the sample in FIG. 10(b), in which it can be seen that the support body extending from the lower film and the floating-type Ag nanoparticle supported by the support body are manufactured. Here, an etching rate of the etching solution was 4 nm/sec, and the etch depth was controlled by adjusting an etch time.

FIG. 11(b) is an SEM photograph illustrating observation of a sample in which an Ag film of 30 nm was formed using an E-beam evaporator using the floating-type Ag nanoparticles as a deposition mask in the sample of FIG. 11(a). Here, a deposition rate of the Ag film was 0.7 nm/sec, and a thickness of the deposited Ag film was controlled by adjusting a deposition time.

As can be seen from FIG. 11(b), only the Ag film is formed and it can be seen that a ring-shaped hot spot (nanogap) is formed between the Ag film and the Ag nanoparticles in a self-aligning manner. It may also be seen from FIG. 11(b) that the empty space E is well defined under the floating-type Ag nanoparticles. Also, in the sample of FIG. 11(b), an SERS active structure based on the floating-type Ag nanoparticles and Ag metal film according to positions on the silicon wafer was observed, and although an element was manufactured in a large area of 2 cm×2 cm, a meaningful change in the SERS active structure according to positions was not observed. It can be seen by the SEM and through observation of the SERS activity that ultrafine nanogaps were uniformly formed even in the large area, and since the Al metal film is manufactured through directional deposition, formation of Ag particles that may form a random gap on the side surface of the support body, or the like, may be prevented.

Figure 12:
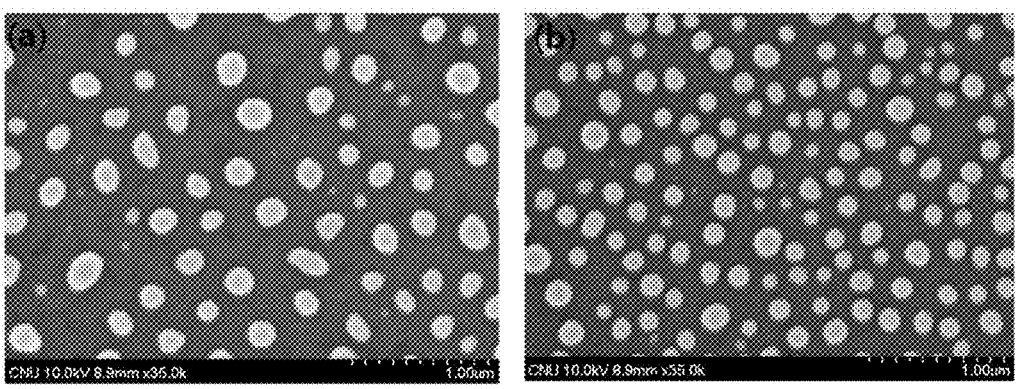
FIG. 12 shows photographs illustrating observation of a sample (FIG. 12(a)) in which a metal film is formed and heat-treated and a sample (FIG. 12(b)) in which a metal film is formed again on the sample (FIG. 12(a)) and heat-treated to have metal nanoparticles increased in density, observed by an SEM.

FIG. 12 is a photograph illustrating observation of an increase in density of metal nanoparticles according to repetition of the unit process. Specifically, FIG. 12(a) is an SEM photograph illustrating that an Ag film having a thickness of 14 nm was formed on a silicon oxide layer, and after a temperature was raised up to 400° C. at a heating rate of 15° C./sec using RTP equipment, and a surface of the sample heat-treated for 1 minute was observed, and FIG. 12(b) is an SEM photograph illustrating that an Ag film having a thickness of 14 nm was formed again on the sample of FIG. 12(a) and heat-treated in the same manner as that of the sample of FIG. 12(a), and the Ag nanoparticle was observed.

As can be seen from FIGS. 12(a) and 12(b), it can be seen that, by repeating the unit process, the density of the Ag nanoparticles was increased by 1.5 times, without significantly affecting the particle size or size distribution.

Figure 10:
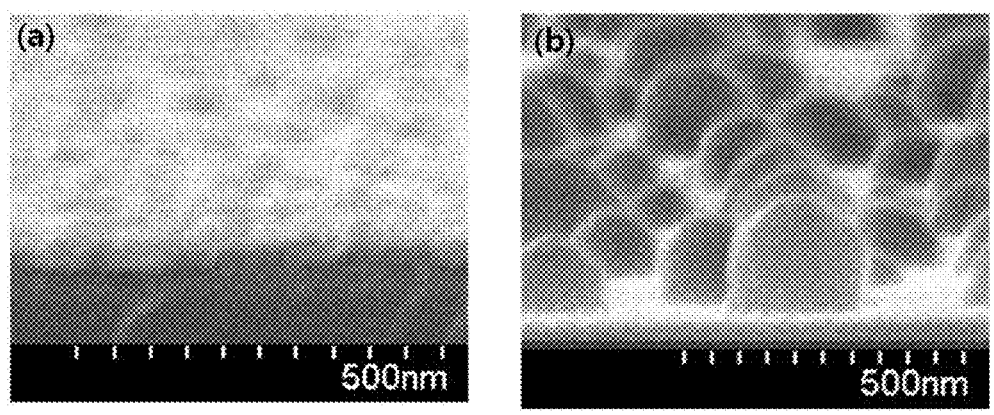
FIG. 10 shows photographs illustrating observation of a sample (FIG. 10(a)) in which a compound film and a metal layer are formed on a base substrate and a sample (FIG. 10(b)) obtained by heat-treating the sample of FIG. 10(a), observed by a scanning electron microscope (SEM).
Figure 13:
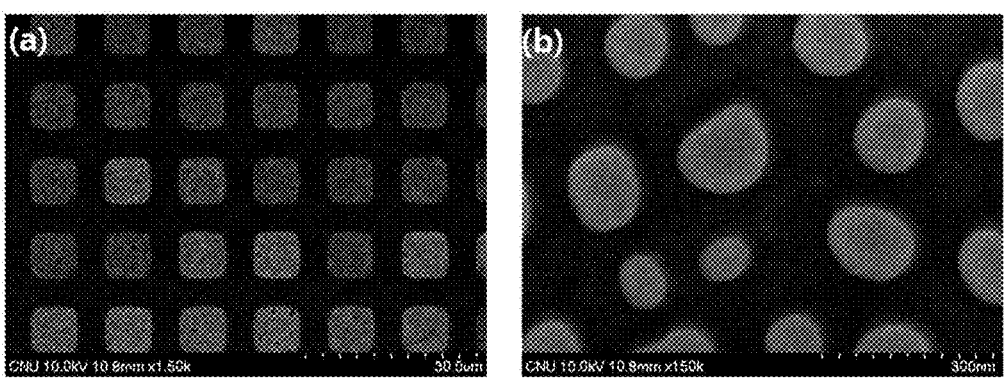
FIG. 13 illustrates a sample in which a patterned metal film is formed and heat-treated to have a patterned SERS active region (FIG. 13(a)) and the active region is observed (FIG. 13(b)).

FIG. 13(a) is an SEM photograph illustrating observation of a patterned Ag film formed on a silicon oxide and FIG. 13(b) is an SEM photograph illustrating observation of an Ag nanoparticle manufactured by heat-treating the patterned Ag film in the same manner as that of the sample of FIG. 10. Through FIGS. 13(a) and 13(b), it can be seen that a multiplexing-available SERS substrate is produced by patterning the Ag film on the dielectric film (compound film) only.

Figure 14:
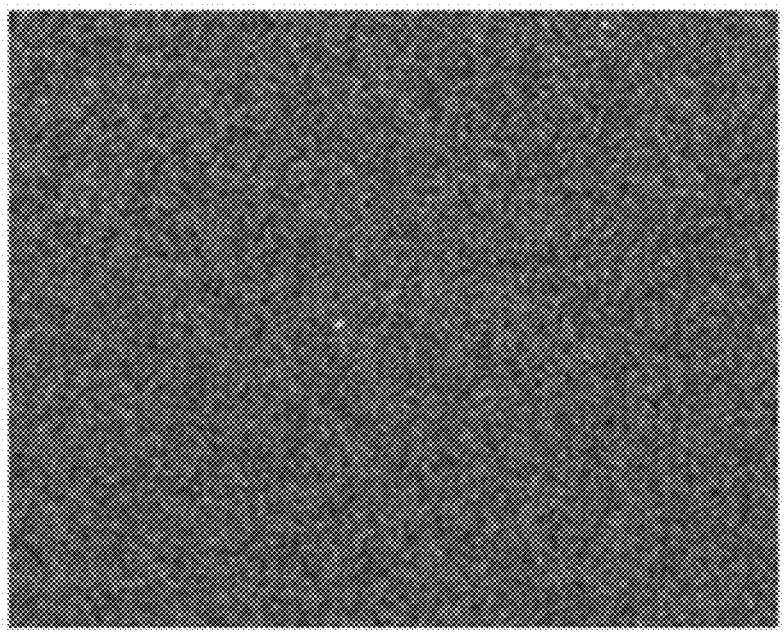
FIG. 14 illustrates a dark field image of a sample prepared by depositing a metal film having the same thickness as that of the sample of FIG. 11(b) after varying an isotropic etching depth of a compound film.

FIG. 14 is a photograph illustrating observation of dark field images of samples manufactured by depositing an Ag film having a thickness of 30 nm using an E-beam evaporator after a silicon oxide layer was etched to a depth of 32 nm by adjusting an etch time, using the samples of FIG. 10(b).

Figure 15:
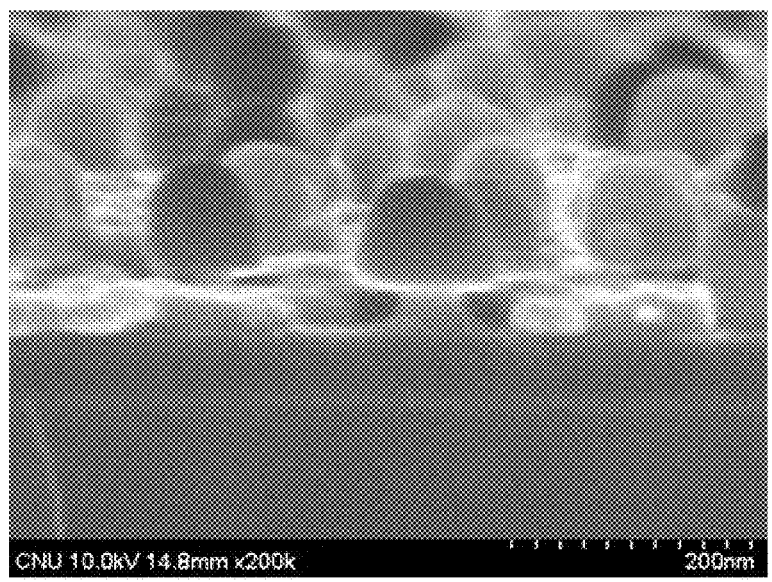
FIG. 15 illustrates a photograph of the sample of FIG. 14, observed by an SEM.

FIG. 15 is an SEM photograph of the sample of FIG. 14. As can be seen from FIG. 15, it can be observed that, although the Ag films having the same thickness are formed, the sizes of the nanogaps are precisely and uniformly adjusted by controlling a height of the floating-type Ag nanoparticles by adjusting etch depth.

Figure 16:
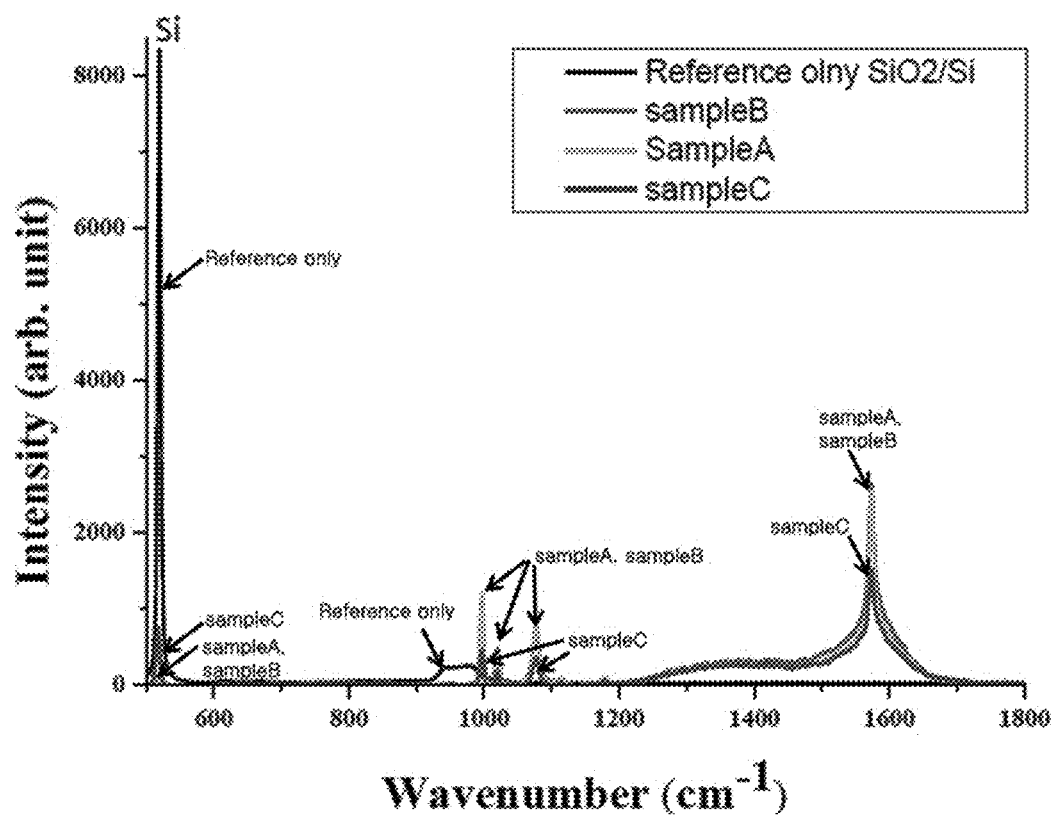
FIG. 16 is a diagram illustrating a Raman scattering spectrum of an SERS substrate.

FIG. 16 is a graph illustrating SERS spectrums of samples in which an etching depth of the silicon oxide layer was adjusted to 6 nm (sample A in FIG. 16), 24 nm (sample B in FIG. 16) or 32 nm (sample C in FIG. 16) and an SERS spectrum of a sample (reference only SiO$_2$/Si of FIG. 16) in which only the silicon oxide layer before etching is formed on the Si substrate as a reference. For Raman scattering experiment, a chemical bond having a thiol functional group so as to be strong to the same metal surfaces (Au, Ag, etc.) may be formed and a benzenethiol ($C_6H_6SH$) having a weak photochemical reactivity was used. In detail, the manufactured samples were kept in acetone or ethyl alcohol solution for 1 day or longer to remove organic impurities present on the surface, and each washed sample was reacted with 2 mM benzenethiol solution (solvent:ethanol) for 1 day or longer. After the reaction, excess benzene thiol physically adsorbed on the surface was removed by washing with excess ethanol so that only benzene thiol adsorbed strongly by a chemical bond after reaction should remain on the surface of the sample. The samples were dried in nitrogen and stored in an airtight container for Raman analysis. A 632.8 nm laser light was irradiated to the samples and Raman signal was measured using a Micro Raman system (Horiba, HR-800). It can be seen that a strong signal observed in the region of 1000-1100 $cm^{-1}$ illustrated in FIG. 16 and near 1580 $cm^{-1}$ is consistent with an SERS signal unique to benzenethiol.

As can be seen from FIG. 16, it can be seen that intensity of a peak on the SERS spectrum changes according to a change in the size of the nanogap, and in the case of sample A and sample B, a peak stronger than the sample C occurs in a 1600 ($cm^{-1}$) frequency (wavenumber) region.

Figure 17:
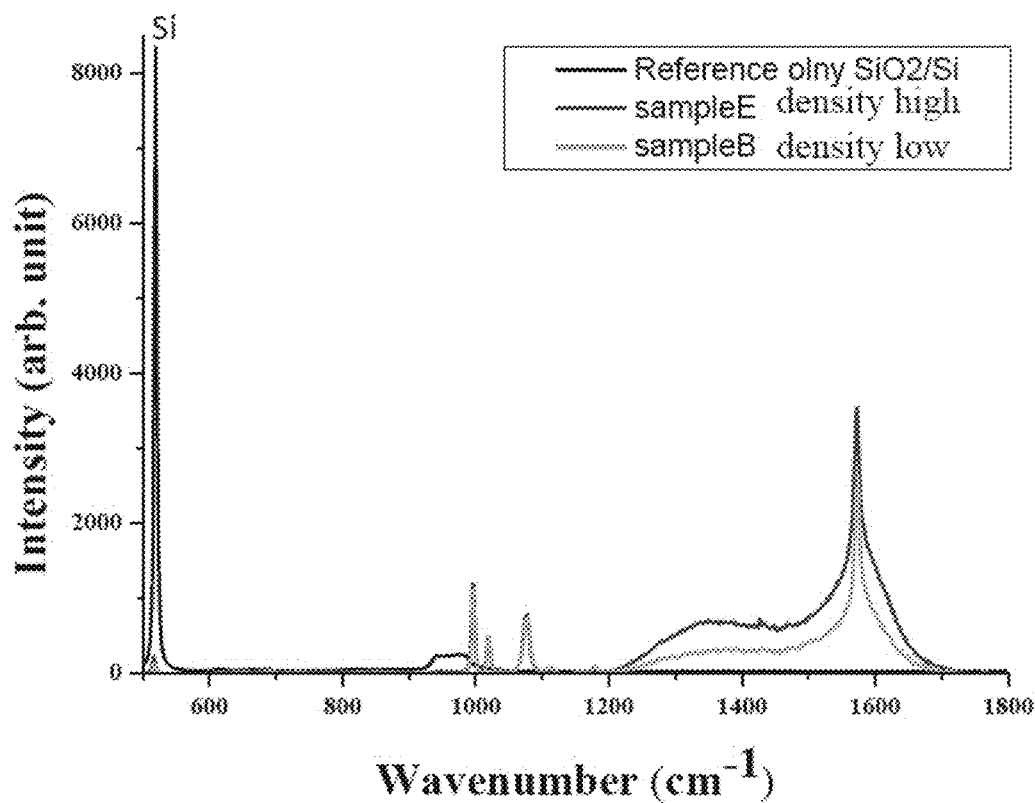
FIG. 17 is another diagram illustrating a Raman scattering spectrum of an SERS substrate.

FIG. 17 is a graph illustrating an SERS spectrum of a sample E (etch depth and thickness of Ag film are the same as those of sample B) in which density of the Ag nanoparticle was increased by 1.5 times than the Ag nanoparticle density of sample B by the same method as the example of the sample of FIG. 12(*b*) together with the SERS spectrum of sample B of FIG. 16. In FIG. 17, an SERS spectrum of the sample (Reference only $SiO_2$/Si of FIG. 17) in which only the silicon oxide layer before etching was formed on the Si substrate as a reference. As can be seen from FIG. 17, density of hot spots were increased by 1.5 times and a peak of the 1600 ($cm^{-1}$) frequency region was also increased by 1.5 times.

Figure 11:
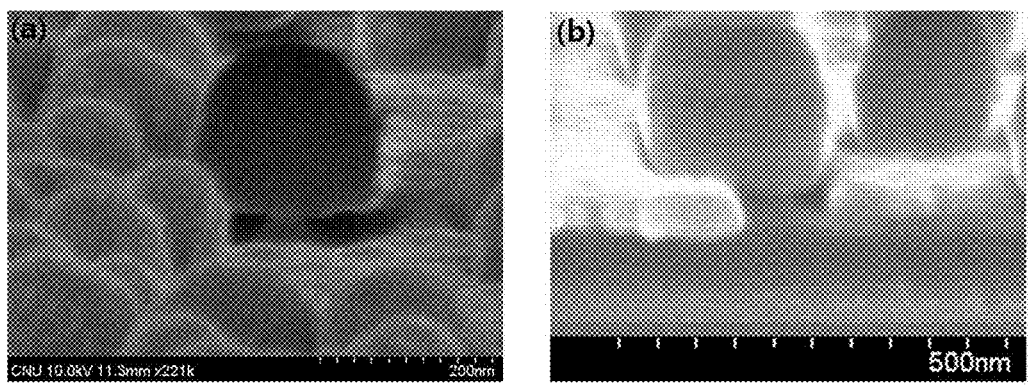
FIG. 11 shows photographs illustrating observation of a sample (FIG. 11(a)) obtained by isotropic-etching the sample of (FIG. 10(b)) and a sample (FIG. 11(b)) obtained by depositing a metal film on the sample of FIG. 11(a)), observed by an SEM.
Figure 18:
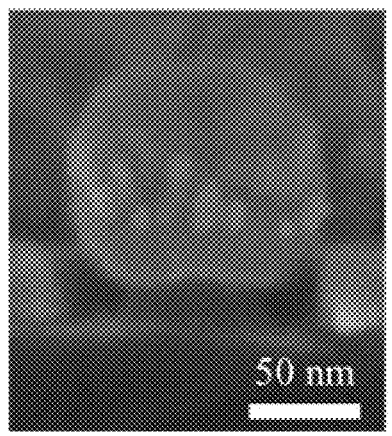
FIG. 18 illustrates a photograph of an SERS substrate in which both metals of a first metal nanoparticle and a metal of a second metal film are Au, observed by an SEM.
Figure 19:
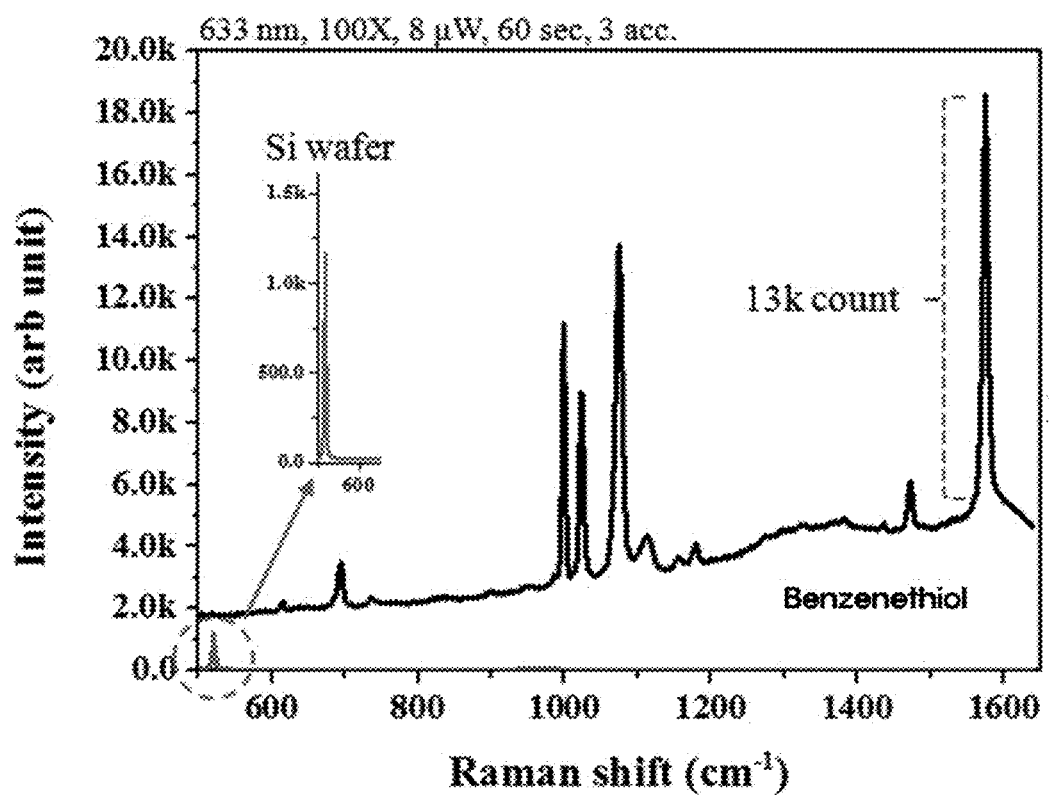
FIG. 19 is a diagram illustrating a Raman scattering spectrum of an SERS substrate of FIG. 18.

FIG. 18 is an SEM photograph illustrating observation of a sample, which is manufactured to be similar to the sample of FIG. 11(*b*), in which an Au film having a thickness of 11 nm was formed on a silicon oxide film and RTP-treated for one minute at 550° C., and the silicon oxide layer was wet-etched to a depth of 20 nm and an Au film (second metal film) was deposited with a thickness of 30 nm using an e-beam evaporator, and FIG. 19 is a graph illustrating an SERS spectrum using the sample of FIG. 18. The Raman scattering experiment was performed in the same manner as in the example of FIG. 16. As can be seen from FIG. 19, even though the measurement was performed using an extremely low energy laser beam of 8 μW, a strong SERS signal was measured and a signal 13 times stronger than the Raman signal of the silicon substrate was measured.

Figure 20:
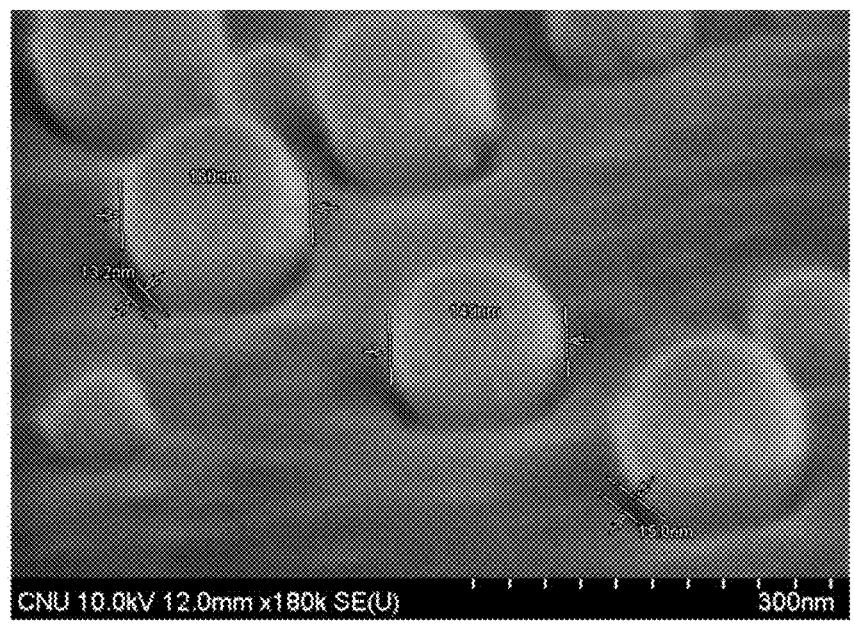
FIG. 20 illustrates a photograph of an SERS substrate in which a lower film is a metal film and both metals of a first metal nanoparticle and a second metal film are Au, observed by an SEM.
Figure 21:
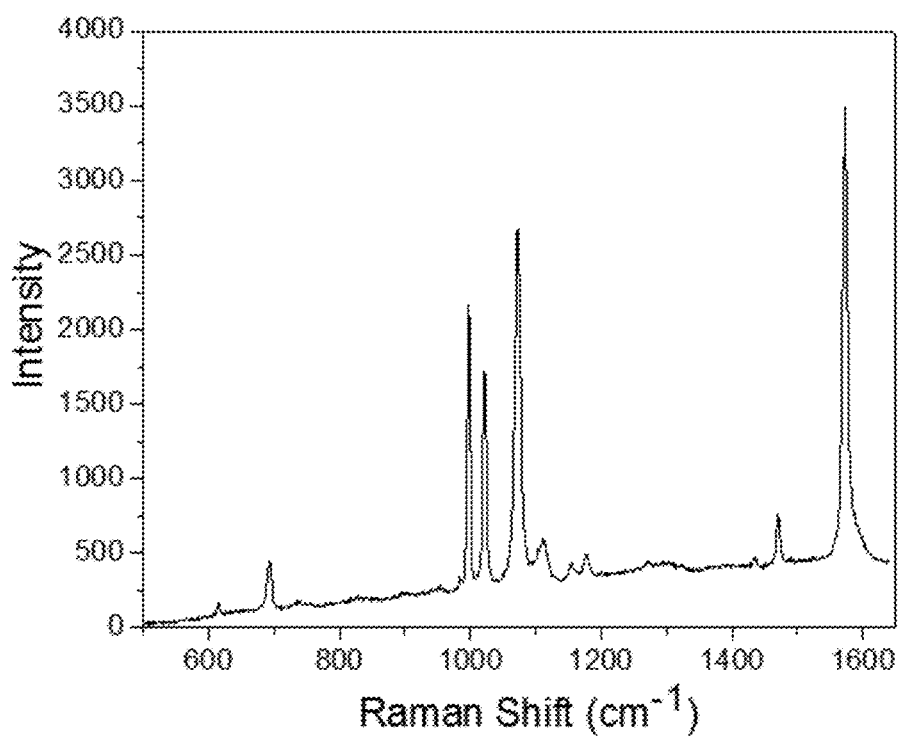
FIG. 21 is a diagram illustrating Raman scattering spectrum of an SERS substrate of FIG. 20.

FIG. 20 is an SEM photograph illustrating observation of a Raman scattering substrate manufactured in the same manner as the sample of FIG. 18, except that a 20 nm-thick silicon oxide layer was formed on an Au film after forming an Au film of 50 nm thickness on a base substrate which is a silicon wafer. In detail, an Au film having a thickness of 50 nm was formed on the base substrate as a silicon wafer, a silicon oxide layer having a thickness of 20 nm was formed on the Au film, and an Au film was formed and RTP heat-treated in the same manner as that of the sample of FIG. 18. Thereafter, the silicon oxide layer was wet-etched to a depth of 20 nm using an etching solution (HF:$NH_4F$ (1:6 (v/v)) so that the silicon oxide layer, excluding the lower side of the Au nanoparticle, was entirely removed. Thereafter, the sample in which the Au film having a thickness of 30 nm using floating-type Au nanoparticles as a deposition mask in the same manner as that of the sample of FIG. 18 was observed. FIG. 21 is a graph illustrating a SERS spectrum of the sample of FIG. 20, in which the Raman scattering experiment was performed on the sample of FIG. 20 in the same manner as the example of FIG. 16. It can be seen that, through the spectrum of FIG. 21, when the metal film is provided as the lower film, loss of Raman scattering light to the lower portion of the substrate is prevented, improving intensity thereof.

While the present invention has been particularly illustrated and described with reference to exemplary embodiments thereof, it is to be understood that the invention is not limited to the disclosed exemplary embodiments. Various modifications and changes may be made by those skilled in the art to which the present invention pertains.

Accordingly, the technical concept of the present invention should not be construed as being limited to the embodiments described, and all the equivalents or modifications of the claims, as well as the claims set forth below, fall within the scope of the present invention.

The invention claimed is:

1. A surface enhanced Raman scattering (SERS) substrate comprising:
   a floating-type metal nanoparticle;
   a support body supporting the metal nanoparticle; and
   a metal film forming a nanogap with the metal nanoparticle and surrounding the metal nanoparticle,
   wherein a metal of the metal nanoparticle and a metal of the metal film are metals generating surface plasmons and a bottom face of the metal nanoparticle supported by the support body is planar and includes both a supported region forming an interface with the support body and a non-supported region exposed to a surface, and
   wherein an area of 10% to 80% with respect to an area of the bottom face forms an interface with the support body.

2. The SERS substrate of claim 1, wherein the nanogap is formed by the metal nanoparticle and a side surface of the metal film including an edge of the metal film surrounding the metal nanoparticle.

3. The SERS substrate of claim 1, wherein the nanogap has an annular shape.

4. The SERS substrate of claim 1, wherein a detection target is positioned in a space defined by the metal nanoparticle including the non-supported region of the bottom face of the metal nanoparticle, a side surface of the metal film, and a side surface of the support body.

5. The SERS substrate of claim 1, wherein the floating-type metal nanoparticle supported by the support body is positioned inside a penetrating pore of the metal film.

6. The SERS substrate of claim 5, wherein the metal nanoparticle, the penetrating pore, and the support body form a concentric structure with each other.

7. The SERS substrate of claim 1, further comprising a lower film positioned below the metal film and the floating-type metal nanoparticle.

8. The SERS substrate of claim 7, wherein the lower film is formed of the same material as that of the support body, and the support body extends from the lower film.

9. The SERS substrate of claim 7, wherein the lower film is a metal.

10. The SERS substrate of claim 7, wherein a receptor specifically binding to a detection target material is formed on a surface of the lower film positioned below the floating-type metal nanoparticle or on a surface of a side portion of the support body.

11. The SERS substrate of claim 7, wherein the support body is formed of one or two or more selected from the group consisting of a metal compound and a semiconductor compound, and independently thereof, the lower film is formed of one or two or more selected from the group consisting of a metal, a metal compound and a semiconductor compound.

12. The SERS substrate of claim 1, wherein the metal nanoparticle has a truncated sphere shape.

13. The SERS substrate of claim 1, wherein a size of the nanogap is 1 nm to 100 nm.

14. The SERS substrate of claim 1, wherein a size of the nanogap is adjusted by one or more factors selected from the group consisting of a length of the support body and a thickness of the metal film.

15. The SERS substrate of claim 1, wherein an average diameter of a projected shape of the metal nanoparticle is 10 nm to 500 nm.

16. The SERS substrate of claim 1, wherein a thickness of the metal film is 5 nm to 100 nm.

17. The SERS substrate of claim 1, wherein a density of nanostructures as a number of the metal nanoparticles per unit area is 1 to 100 per $\mu m^2$.

18. The SERS substrate of claim 1, wherein the substrate includes an SERS activity region in which the floating-type metal nanoparticle is formed and an SERS non-activity region in which the floating-type metal nanoparticle is not formed, and two or more SERS activity regions are arranged to be spaced apart from each other.

19. The SERS substrate of claim 1, wherein the metal of the metal nanoparticle or the metal of the metal film is silver, gold, platinum, palladium, nickel, aluminum, copper, chromium, or a combination thereof, or an alloy thereof.

20. An element for detecting a molecule, the element comprising:
    the surface enhanced Raman scattering (SERS) substrate of claim 1.

21. A method for manufacturing the surface enhanced Raman scattering (SERS) substrate of claim 1, the method comprising:
    a) forming a compound film as a metal compound or a semiconductor compound on a base substrate;
    b) forming a film on the compound film and performing a heat treatment thereon to form metal nanoislands positioned to be spaced apart from each other on the compound film;
    c) isotropic-etching the compound film to a predetermined depth using the metal nanoislands as an etching mask; and
    d) depositing a metal on the etched compound film using the metal nanoislands as a deposition mask to form the metal film.

22. The method of claim 21, wherein operation b) comprises: controlling a density of the metal nanoislands by repeatedly performing a unit process including b1) forming a film; and b2) performing a heat treatment.

23. The method of claim 21, wherein the isotropic etching is wet etching.

24. The method of claim 21, wherein, in operation c), dry etching is further performed before or after the isotropic etching.

25. The method of claim 21, further comprising:
    forming a lower film of metal film or a film of a metal compound or a semiconductor compound different from the compound film on the base substrate, before operation a),
    wherein the lower film is exposed to a surface in a region not protected by an etching mask through etching including the isotropic etching in operation c).

26. The method of claim 21, wherein an etched compound film remains after etching including the isotropic etching in operation c).

27. The method of claim 21, wherein the deposition in operation d) is directional deposition including thermal evaporation or e-beam evaporation.

28. The method of claim 21, wherein a size of the nanogap is adjusted by controlling at least one of an etching depth in operation c) and a deposition thickness in operation d).

29. The method of claim 21, wherein a patterned film is formed in operation b).

30. The method of claim 21, wherein, in operation b), a thickness of the film is 1 nm to 50 nm.

31. The method of claim 25, further comprising:
    after operation c) and before operation d) or after operation d), forming a receptor specifically binding to a detection target on a surface of the lower film or on the support body obtained by isotropic etching in operation c).

32. The method of claim 21, wherein the heat treatment in operation b) is performed by a rapid thermal process (RTP).

* * * * *